US010249759B2

(12) United States Patent
Tu et al.

(10) Patent No.: US 10,249,759 B2
(45) Date of Patent: Apr. 2, 2019

(54) CONNECTION ARRANGEMENTS FOR INTEGRATED LATERAL DIFFUSION FIELD EFFECT TRANSISTORS

(71) Applicant: Silanna Asia Pte Ltd, Singapore (SG)

(72) Inventors: Shanghui Larry Tu, San Diego, CA (US); Michael A. Stuber, Rancho Santa Fe, CA (US); Befruz Tasbas, San Diego, CA (US); Stuart B. Molin, Carlsbad, CA (US); Raymond Jiang, Raleigh, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/899,911

(22) Filed: Feb. 20, 2018

(65) Prior Publication Data

US 2018/0240876 A1 Aug. 23, 2018

Related U.S. Application Data

(63) Continuation of application No. 15/588,357, filed on May 5, 2017, now Pat. No. 9,923,059.

(Continued)

(51) Int. Cl.
*H01L 29/10* (2006.01)
*H01L 29/786* (2006.01)
(Continued)

(52) U.S. Cl.
CPC ........ *H01L 29/786* (2013.01); *H01L 21/4825* (2013.01); *H01L 21/4853* (2013.01);
(Continued)

(58) Field of Classification Search
None
See application file for complete search history.

(56) References Cited

U.S. PATENT DOCUMENTS

| 4,738,936 A | 4/1988 | Rice |
| 5,365,102 A | 11/1994 | Mehrotra et al. |

(Continued)

FOREIGN PATENT DOCUMENTS

| DE | 19647324 A1 | 5/1997 |
| KR | 20100087115 A | 8/2010 |

(Continued)

OTHER PUBLICATIONS

Notice of Allowance dated May 29, 2018 for U.S. Appl. No. 15/640,081.

(Continued)

*Primary Examiner* — Asok K Sarkar
*Assistant Examiner* — Grant S Withers
(74) *Attorney, Agent, or Firm* — The Mueller Law Office, P.C.

(57) ABSTRACT

In an active layer over a semiconductor substrate, a semiconductor device has a first lateral diffusion field effect transistor (LDFET) that includes a source, a drain, and a gate, and a second LDFET that includes a source, a drain, and a gate. The source of the first LDFET and the drain of the second LDFET are electrically connected to a common node. A first front-side contact and a second front-side contact are formed over the active layer, and a substrate contact electrically connected to the semiconductor substrate is formed. Each of the first front-side contact, the second front-side contact, and the substrate contact is electrically connected to a different respective one of the drain of the first LDFET, the source of the second LDFET, and the common node.

19 Claims, 14 Drawing Sheets

Related U.S. Application Data

(60) Provisional application No. 62/461,117, filed on Feb. 20, 2017.

(51) Int. Cl.

| | | |
|---|---|---|
| *H01L 27/12* | (2006.01) | |
| *H01L 29/78* | (2006.01) | |
| *H01L 29/06* | (2006.01) | |
| *H01L 21/84* | (2006.01) | |
| *H01L 21/74* | (2006.01) | |
| *H01L 29/66* | (2006.01) | |
| *H01L 21/48* | (2006.01) | |
| *H01L 21/768* | (2006.01) | |
| *H01L 23/48* | (2006.01) | |
| *H01L 23/495* | (2006.01) | |
| *H01L 23/00* | (2006.01) | |
| *H01L 29/417* | (2006.01) | |
| *H01L 23/522* | (2006.01) | |
| *H01L 23/535* | (2006.01) | |
| *H01L 25/00* | (2006.01) | |

(52) U.S. Cl.
CPC ...... *H01L 21/743* (2013.01); *H01L 21/76898* (2013.01); *H01L 21/84* (2013.01); *H01L 23/481* (2013.01); *H01L 23/4951* (2013.01); *H01L 23/49513* (2013.01); *H01L 23/49517* (2013.01); *H01L 23/49524* (2013.01); *H01L 23/49541* (2013.01); *H01L 23/49568* (2013.01); *H01L 23/49575* (2013.01); *H01L 23/5225* (2013.01); *H01L 23/535* (2013.01); *H01L 24/40* (2013.01); *H01L 24/41* (2013.01); *H01L 24/49* (2013.01); *H01L 24/73* (2013.01); *H01L 24/84* (2013.01); *H01L 25/50* (2013.01); *H01L 27/1203* (2013.01); *H01L 27/1207* (2013.01); *H01L 29/0649* (2013.01); *H01L 29/1087* (2013.01); *H01L 29/1095* (2013.01); *H01L 29/41766* (2013.01); *H01L 29/66659* (2013.01); *H01L 29/66681* (2013.01); *H01L 29/66696* (2013.01); *H01L 29/7816* (2013.01); *H01L 29/7824* (2013.01); *H01L 29/7835* (2013.01); *H01L 23/49562* (2013.01); *H01L 24/32* (2013.01); *H01L 24/48* (2013.01); *H01L 2224/32245* (2013.01); *H01L 2224/4001* (2013.01); *H01L 2224/40141* (2013.01); *H01L 2224/40245* (2013.01); *H01L 2224/48091* (2013.01); *H01L 2224/48108* (2013.01); *H01L 2224/48247* (2013.01); *H01L 2224/73213* (2013.01); *H01L 2224/73265* (2013.01)

(56) References Cited

U.S. PATENT DOCUMENTS

| | | | |
|---|---|---|---|
| 5,378,912 A | 1/1995 | Pein | |
| 5,382,818 A | 1/1995 | Pein | |
| 5,521,414 A | 5/1996 | Palara | |
| 5,548,150 A | 8/1996 | Omura et al. | |
| 5,559,044 A | 9/1996 | Williams et al. | |
| 5,773,852 A | 6/1998 | Han et al. | |
| 5,869,875 A | 2/1999 | Hebert | |
| 5,889,310 A | 3/1999 | Terashima et al. | |
| 6,025,237 A | 2/2000 | Choi | |
| 6,049,108 A | 4/2000 | Williams et al. | |
| 6,078,090 A | 6/2000 | Williams et al. | |
| 6,084,284 A | 7/2000 | Adamic | |
| 6,294,838 B1 | 9/2001 | Peng | |
| 6,476,442 B1 | 11/2002 | Williams et al. | |
| 6,692,998 B2 | 2/2004 | Maciejewski et al. | |
| 6,794,719 B2 | 9/2004 | Petruzzello et al. | |
| 7,008,821 B1 | 3/2006 | Shao et al. | |
| 7,235,845 B2 | 6/2007 | Xu et al. | |
| 7,273,771 B2 | 9/2007 | Kinzer | |
| 7,282,765 B2 | 10/2007 | Xu et al. | |
| 7,420,247 B2 | 9/2008 | Xu et al. | |
| 7,446,375 B2 | 11/2008 | Xu et al. | |
| 7,560,808 B2 | 7/2009 | Korec et al. | |
| 7,576,388 B1 | 8/2009 | Wilson et al. | |
| 7,589,378 B2 | 9/2009 | Kocon et al. | |
| 7,598,128 B2 | 10/2009 | Hsu et al. | |
| 7,629,645 B2 | 12/2009 | Montanini et al. | |
| 7,713,821 B2 | 5/2010 | Hsu et al. | |
| 7,719,054 B2 | 5/2010 | Williams et al. | |
| 7,745,846 B2 | 6/2010 | Korec et al. | |
| 7,745,920 B2 | 6/2010 | Lee et al. | |
| 7,829,947 B2 | 11/2010 | Hébert | |
| 7,842,568 B2 | 11/2010 | Anderson et al. | |
| 7,952,145 B2 | 5/2011 | Korec et al. | |
| 8,101,993 B2 | 1/2012 | Hsieh | |
| 8,198,154 B2 | 6/2012 | Hebert | |
| 8,674,440 B2 | 3/2014 | Korec et al. | |
| 8,847,310 B1 | 9/2014 | Korec | |
| 8,928,116 B2 | 1/2015 | Korec et al. | |
| 8,994,105 B2 | 3/2015 | Korec | |
| 8,994,115 B2 | 3/2015 | Korec et al. | |
| 9,159,825 B2 | 10/2015 | Molin et al. | |
| 9,324,838 B2 | 4/2016 | Cascino et al. | |
| 9,349,677 B2 | 5/2016 | Cho et al. | |
| 9,373,571 B2 | 6/2016 | Denison et al. | |
| 9,412,881 B2 | 8/2016 | Korec et al. | |
| 9,412,911 B2 | 8/2016 | Atankackovic | |
| 9,466,536 B2 | 10/2016 | Goktepeli et al. | |
| 9,524,957 B2 | 12/2016 | Hebert et al. | |
| 9,530,796 B2 | 12/2016 | Stuber et al. | |
| 9,583,477 B2 | 2/2017 | Cho et al. | |
| 9,589,929 B2 | 3/2017 | Terrill et al. | |
| 2002/0017697 A1 | 2/2002 | Kitamura et al. | |
| 2003/0094654 A1 | 5/2003 | Christensen et al. | |
| 2004/0201061 A1 | 10/2004 | Jeon et al. | |
| 2004/0238913 A1 | 12/2004 | Kwon et al. | |
| 2004/0245633 A1 | 12/2004 | Alter et al. | |
| 2006/0001110 A1 | 1/2006 | Igarashi | |
| 2006/0261382 A1 | 11/2006 | Khemka et al. | |
| 2007/0034942 A1 | 2/2007 | Xu et al. | |
| 2007/0080431 A1 | 4/2007 | Hung et al. | |
| 2007/0108469 A1 | 5/2007 | Nakano et al. | |
| 2007/0138548 A1 | 6/2007 | Kocon et al. | |
| 2007/0235769 A1 | 10/2007 | Rosa et al. | |
| 2008/0012043 A1 | 1/2008 | Udrea et al. | |
| 2008/0023785 A1 | 1/2008 | Hebert | |
| 2008/0122006 A1 | 5/2008 | Williams et al. | |
| 2008/0150094 A1 | 6/2008 | Anderson | |
| 2008/0197411 A1 | 8/2008 | Korec et al. | |
| 2008/0246086 A1 | 10/2008 | Korec et al. | |
| 2008/0315304 A1 | 12/2008 | Hsu et al. | |
| 2009/0179264 A1 | 7/2009 | Korec et al. | |
| 2009/0273029 A1 | 11/2009 | Tien et al. | |
| 2010/0002374 A1 | 1/2010 | Sasagawa et al. | |
| 2010/0025763 A1 | 2/2010 | Paul et al. | |
| 2010/0127347 A1 | 5/2010 | Quinn | |
| 2010/0171543 A1 | 7/2010 | Korec et al. | |
| 2010/0237414 A1 | 9/2010 | Hsieh | |
| 2010/0301413 A1 | 12/2010 | You | |
| 2010/0314683 A1 | 12/2010 | Yanagi | |
| 2010/0315159 A1 | 12/2010 | Kocon et al. | |
| 2011/0024839 A1 | 2/2011 | Zinn et al. | |
| 2011/0084314 A1 | 4/2011 | Or-Bach et al. | |
| 2011/0127602 A1 | 6/2011 | Mallikarjunaswamy | |
| 2011/0148376 A1 | 6/2011 | Xu et al. | |
| 2011/0148506 A1 | 6/2011 | Korec et al. | |
| 2011/0198927 A1 | 8/2011 | Korec et al. | |
| 2011/0241170 A1 | 10/2011 | Haeberlen et al. | |
| 2011/0292632 A1 | 12/2011 | Wen et al. | |
| 2011/0303976 A1 | 12/2011 | Kocon et al. | |
| 2011/0309438 A1 | 12/2011 | Ichijo et al. | |
| 2012/0012982 A1 | 1/2012 | Korec et al. | |
| 2012/0032262 A1 | 2/2012 | Toren et al. | |
| 2012/0181681 A1 | 7/2012 | Cho et al. | |
| 2012/0220091 A1 | 8/2012 | Challa et al. | |

(56) References Cited

U.S. PATENT DOCUMENTS

| | | |
|---|---|---|
| 2012/0299119 A1 | 11/2012 | Xue et al. |
| 2013/0009253 A1 | 1/2013 | Wang et al. |
| 2014/0035047 A1 | 2/2014 | Korec et al. |
| 2014/0061884 A1 | 3/2014 | Carpenter et al. |
| 2014/0167269 A1 | 6/2014 | Lu et al. |
| 2014/0210107 A1 | 7/2014 | Zhai |
| 2014/0264611 A1 | 9/2014 | Lee et al. |
| 2014/0273344 A1 | 9/2014 | Terrill et al. |
| 2016/0064361 A1 | 3/2016 | Denison et al. |
| 2017/0221885 A1 | 8/2017 | Sander et al. |

FOREIGN PATENT DOCUMENTS

| | | |
|---|---|---|
| KR | 20130119439 A | 10/2013 |
| TW | 200805510 A | 1/2008 |
| TW | 201133856 A | 10/2011 |
| WO | 2003036699 A3 | 9/2003 |

OTHER PUBLICATIONS

International Search Report dated May 16, 2018 for PCT Patent Application Nu. PCT/IB2018/050905.

International Search Report dated May 21, 2018 for PCT Patent Application Nu. PCT/IB2018/050907.

International Search Report dated May 21, 2018 for PCT Patent Application Nu. PCT/IB2018/050909.

Nenadovic, et al., "RF Power Silicon-On-Glass VDMOSFETs," IEEE, vol. 25, No. 6, Jun. 2004, pp. 424-426.

Nenadovic, et al., "VDMOS and LDMOS transistors For RF-power applications," ResearchGate, Nov. 2002, pp. 61-68.

Notice of Allowance dated Nov. 9, 2017 for U.S. Appl. No. 15/588,357.

Office Action dated Dec. 15, 2017 for U.S. Appl. No. 15/640,081.

Office Action dated Sep. 5, 2017 for U.S. Appl. No. 15/588,357.

Yuanzheng Zhu et al., "Folded Gate LDMOS Transistor with Low On-Resistance and High Transconductance," IEEE vol. 48, No. 12, Dec. 2001, pp. 2917-2928.

Notice of Allowance dated Sep. 26, 2018 for U.S. Appl. No. 15/853,357.

__US 10,249,759 B2__

CONNECTION ARRANGEMENTS FOR INTEGRATED LATERAL DIFFUSION FIELD EFFECT TRANSISTORS

CROSS-REFERENCE TO RELATED APPLICATION

This patent application is a continuation of U.S. patent application Ser. No. 15/588,357, filed May 5, 2017, which claims the benefit of U.S. Provisional Application No. 62/461,117, filed Feb. 20, 2017, both of which are incorporated by reference herein in their entirety.

BACKGROUND

Semiconductor power devices are specialized devices that typically are used as switches or rectifiers in power electronics circuits. Semiconductor power devices are characterized by their ability to withstand high voltages and large currents as well as the high temperatures associated with high power operation. For example, a switching voltage regulator typically includes two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

A typical semiconductor power device package includes a set of discrete power transistors each of which is fabricated on its own respective semiconductor die. The individual dice are encapsulated in an insulating mold compound with a leadframe structure that provides external electrical connections for individual devices or integrated circuits formed in the semiconductor dice. The leadframe structure typically includes a central paddle surrounded by leads. The semiconductor dice typically are mounted on the paddle, and die pads on the semiconductor dice are electrically connected to respective ones of the leads. For each discrete power transistor die, current typically flows vertically through the die between a front-side contact and a backside contact that typically is electrically connected to the package paddle.

High power semiconductor applications, such as power switching and power handling, require electrical connections between the die pads and the package leads that are characterized by high current carrying capacity, low resistance, and/or low inductance. For these reasons, efforts have been made to use electrically conductive ribbon or preformed clips composed of copper, copper alloy, or aluminum instead of bond wires for high power electrical connections within semiconductor packages. Electrically conductive clips, however, are physically large and difficult to mechanically position on a chip with high accuracy.

In a typical semiconductor power device package, each discrete power transistor die is electrically connected to the package with a single front-side high-current package lead, a single front-side low-current package lead for gate control, and a backside connection to the package paddle. With only a single high-current front-side connection per die, electrically conductive clips readily can be used for the front-side connections in these types of package arrangements without compromising manufacturability or performance.

Power devices may be implemented using lateral diffusion field effect transistors (LDFETs), such as lateral diffusion metal oxide semiconductor (LDMOS) transistors. These types of transistors are characterized by a "lateral diffusion" region (or low-doped or lightly-doped drain (LDD) region) that corresponds to an extension of the drain region that is less strongly doped than the core drain region and that extends laterally away from the channel. The lateral diffusion region increases an LDFET's ability to handle higher voltages in the off-state by absorbing portions of the electric field that would otherwise cause source-drain punch-through and to handle larger currents in the on-state by preventing a large potential drop from building up at the drain-body interface which would otherwise result in degradation of the device via the injection of hot carriers into the body of the device.

Lateral power devices, such as LDFETs, typically have front-side source and drain contacts, each of which typically has its own high current, low resistance, and/or low inductance front-side electrical connection. The need for both external (e.g., package) and on-chip electrical connections increases with the number of lateral power devices that are integrated on the same die. The front-side of a semiconductor die, however, has limited space available to accommodate the relatively large sizes of high performance electrical connections. This limitation severely restricts circuit design flexibility, performance, and manufacturability of integrated lateral power device circuits.

SUMMARY

In some examples, a semiconductor device includes a semiconductor substrate supporting an overlying active layer. A first lateral diffusion field effect transistor (LDFET) in the active layer includes a source, a drain, and a gate. A second LDFET in the active layer includes a source, a drain, and a gate. A common node is electrically connected to the source of the first LDFET and the drain of the second LDFET. A first front-side contact is over the active layer and is electrically connected to a first one of the drain of the first LDFET, the source of the second LDFET, and the common node. A second front-side contact is over the active layer and is electrically connected to a second one of the drain of the first LDFET, the source of the second LDFET, and the common node. A substrate contact is electrically connected to the semiconductor substrate and a third one of the drain of the first LDFET, the source of the second LDFET, and the common node. Each of the first front-side contact, the second front-side contact, and the substrate contact is electrically connected to a different respective one of the drain of the first LDFET, the source of the second LDFET, and the common node.

In some examples, a semiconductor device includes a semiconductor substrate supporting an overlying active layer. A first lateral diffusion field effect transistor (LDFET) in the active layer includes a source, a drain, and a gate. A second LDFET in the active layer includes a source, a drain, and a gate, where the drain of the first LDFET is electrically coupled to the source of the second LDFET. A first front-side contact is over the active layer and is electrically connected to the drain of the first LDFET. A second front-side contact is over the active layer and is electrically connected to the drain of the second LDFET and the source of the first LDFET. A substrate contact is electrically connected to the semiconductor substrate and the source of the second LDFET.

In some examples, a semiconductor device includes a semiconductor substrate supporting an overlying active layer. A first lateral diffusion field effect transistor (LDFET) in the active layer includes a source, a drain, and a gate. A second LDFET in the active layer includes a source, a drain, and a gate, where the drain of the first LDFET is electrically coupled to the source of the second LDFET. A first front-side contact is over the active layer and is electrically connected to the source of the first LDFET. A second front-side contact is over the active layer and is electrically connected to the drain of the second LDFET. A substrate contact is electrically connected to the semiconductor substrate, the drain of the first LDFET, and the source of the second LDFET.

In some examples, a semiconductor device is fabricated. In this process, a first lateral diffusion field effect transistor (LDFET) that includes a source, a drain, and a gate, and a second LDFET that includes a source, a drain, and a gate are formed in an active layer over a semiconductor substrate. The source of the first LDFET and the drain of the second LDFET are electrically connected to a common node. A first front-side contact and a second front-side contact are formed over the active layer, and a substrate contact electrically connected to the semiconductor substrate is formed. Each of the first front-side contact, the second front-side contact, and the substrate contact is electrically connected to a different respective one of the drain of the first LDFET, the source of the second LDFET, and the common node.

DETAILED DESCRIPTION

In the following description, like reference numbers are used to identify like elements. Furthermore, the drawings are intended to illustrate major features of example embodiments in a diagrammatic manner. The drawings are not intended to depict every feature of actual embodiments nor relative dimensions of the depicted elements, and are not drawn to scale.

Examples that are described herein provide integrated lateral diffusion field effect transistor (LDFET) circuits on respective semiconductor dice that respectively include at least one substrate contact to a backside electrical connection that reduces the number of required front-side electrical connections. In this way, these examples increase the front-side space available for accommodating the relatively large sizes of high performance electrical connections, thereby increasing circuit design flexibility, performance, and manufacturability of integrated LDFET power device circuits. In some examples, an LDFET that has a substrate contact is electrically isolated from other LDFETs in the same circuit to further improve the performance of the circuit by preventing the formation of a common node between the LDFETs that are connected to the substrate and those that are not.

Figure 1:
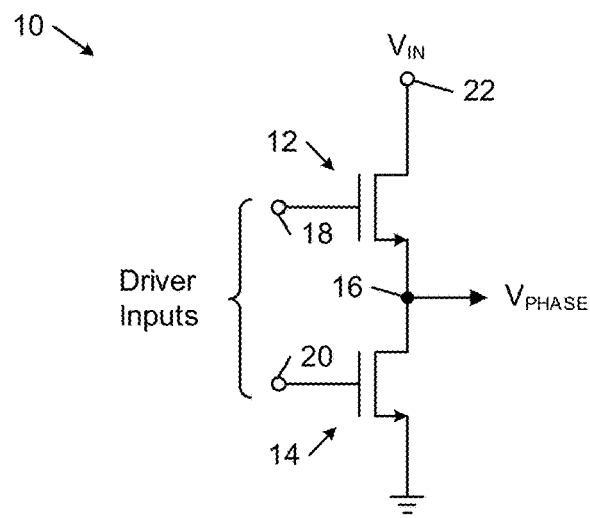
FIG. 1 is a circuit diagram of an example of a high power semiconductor switch incorporating some embodiments.

For illustrative purposes only, this disclosure describes specific examples of single-die, integrated LDFET circuits in the context of embodiments implementing the high power semiconductor switch circuit 10 shown in FIG. 1. The same or similar teachings may be used to fabricate other single-die integrated LDFET circuits that are suitable for both power and non-power applications.

FIG. 1 shows an example of a high power semiconductor switch circuit 10 that includes a high-side field effect transistor (FET) 12 and a low-side FET 14. The source of the high-side FET 12 is coupled to the drain of the low-side FET 14 at a phase node 16. The driver input terminals 18, 20 control the duty cycles of the high-side FET 12 and the low-side FET 14 to convert the input voltage ($V_{IN}$) at the input node 22 to a particular output voltage ($V_{PHASE}$) at the phase node 16. In general, the FETs 12, 14 may be fabricated using any of a wide variety of semiconductor material systems and technologies, including silicon, germanium, and compound semiconductor technologies.

Figure 2:
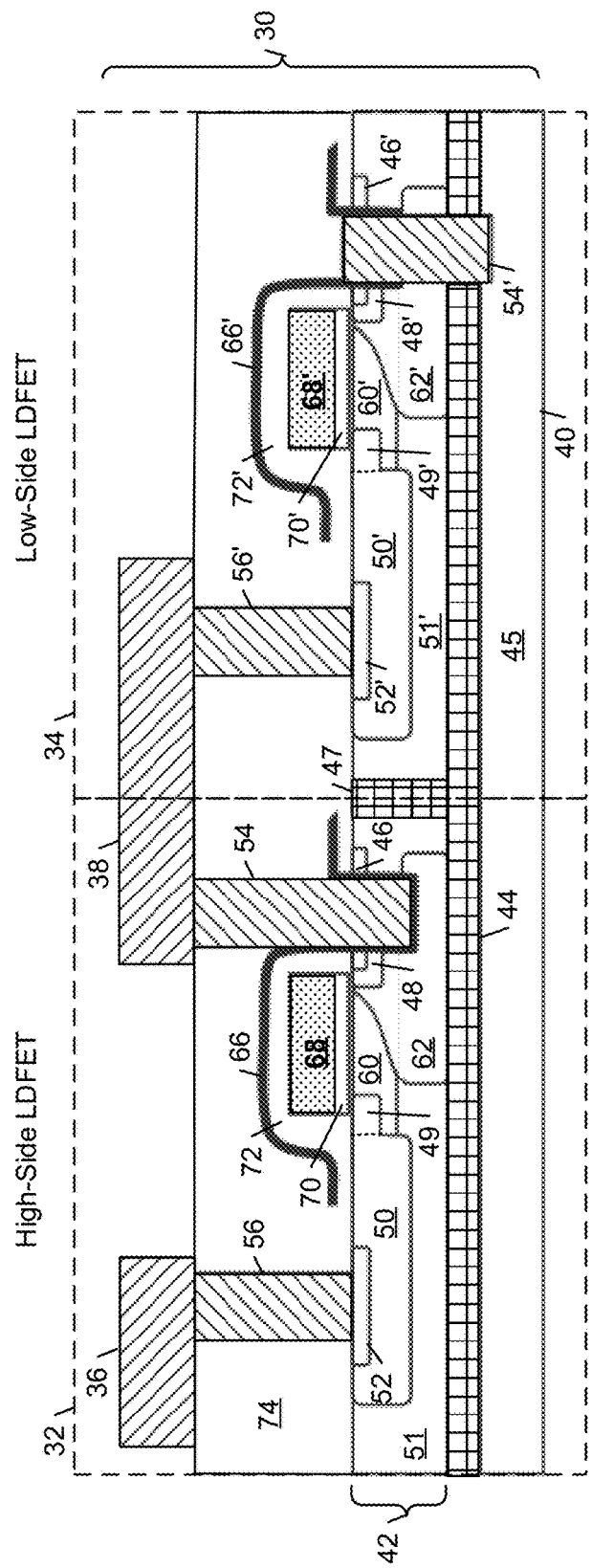
FIG. 2 is a cross-section of an example of an integrated lateral diffusion field effect transistor (LDFET) circuit, in accordance with some embodiments.

FIG. 2 shows a diagrammatic cross-sectional side view of an example of a semiconductor die 30 embodying the high power semiconductor switch circuit 10 of FIG. 1. In this example, a LDFET 32 implements the high-side FET 12 of the switch circuit 10, and a LDFET 34 implements the low-side FET 14 of the switch circuit 10. In one example configuration, an input contact 36 of the high-side LDFET 32 corresponds to the input node 22 of the switch circuit 10, a phase contact 38 corresponds to the phase node 16 of the switch circuit 10, and a substrate contact 40 corresponds to the ground node of the switch circuit 10.

The high-side and low-side LDFETs 32, 34 are implemented in an active layer 42. The active layer 42 can be any of a doped portion of the bulk of a semiconductor wafer, a localized well formed in a larger doped portion of a semiconductor wafer, an active layer of a semiconductor-on-insulator (SOI) wafer, and a localized well formed in an SOI wafer. In the illustrated example, the active layer 42 is a thin film formed over a buried dielectric layer 44 of an SOI substrate 45. In the illustrated example, a dielectric isolation barrier 47 extends between the high-side and low-side LDFETs 32, 34 from the top of the active layer 42 to the buried dielectric layer 44. In some examples, the dielectric isolation barrier 47 is formed using a shallow trench isolation (STI) process.

The high-side LDFET 32 portion of the active layer 42 includes a source region 46 formed in a doped region 48, a lightly doped drain (LDD) region 50 with a heavier doped extension region 49 that are formed in a doped region 51, and drain region 52. The source region 46, the doped region 48, the LDD region 50, the extension region 49, and the drain region 52 can comprise doped semiconductor material formed by, for example, the implant of impurities into active layer 42. The doped semiconductor material of each region 46-52 has a similar conductivity type (e.g., n-type or p-type). Therefore, each region 46-52 can be formed by the same dopant species, such as through the implant of one kind of dopant atom. The LDD region 50 has a lower dopant concentration than the drain region 52 and may also have a lower dopant concentration than the source region 46. The LDD region 50 provides the LDFET with its superior performance as a power device in terms of its ability to hold off large voltages and not degrade while sinking large currents. The presence of LDD region 50 provides the LDFET with its characteristic of having asymmetric source and drain regions. In some approaches, LDD region 50 generally extends laterally at least twice as far from the drain region 52 as the doped region 48 extends from the source region 46.

The high-side LDFET portion of the active layer 42 also includes a body region 60 and a deep well region 62 that have a conductivity type that is opposite the conductivity type of the source, doped, LDD, extension, and drain regions 46-52. The deep well region 62 extends laterally underneath the source region 46 and the portion of body region 60 in which a channel forms. The deep well region 62 enhances the ability of the high-side LDFET 32 to withstand large voltages and serves to remove unwanted charge carriers from body region 60 to prevent a parasitic bipolar junction transistor from activating during the on state of the high-side LDFET 32.

Above the active layer 42, the high-side LDFET 32 includes a gate structure that includes a gate shield 66 and a gate electrode 68. The gate electrode 68 is electrically insulated from the active layer 42 and the gate shield 66 by dielectric material 70, 72, respectively. Source region 46 is electrically coupled to a source contact 54 that is connected to the phase contact 38. Drain region 52 is electrically coupled to a drain contact 56 that is connected to the input contact 36. Drain region 52 can be a highly doped drain region and can form an electrically conductive path between drain contact 56 and LDD region 50. Electrically insulating material 74 (e.g., an interlayer dielectric) electrically isolates the electrical components above the active layer 42. In general, the electrically insulating material 74 and the dielectric material 70, 72 may be the same or similar materials. In addition, in certain approaches, the combination of insulating material 74 and dielectric material 70, 72 can be conceptualized as a single insulating layer in the finished device regardless of when and how they are formed.

A conductive path is formed between source contact 54 and drain contact 56 in response to the application of a voltage to gate electrode 68. The conductive path between source contact 54 and drain contact 56 includes a channel that is selectively formed in body region 60 under the influence of the aforementioned voltage applied to gate electrode 68. While the channel is formed, the transistor is said to be on. While the channel is not formed, and there is no conductive path between source contact 54 and drain contact 56, the transistor is said to be off. There is no conductive path in this situation because source region 46 and drain regions 50, 52 have an opposite conductivity type to body region 60 such that diode junctions are formed at their interfaces.

The gate shield 66 is in ohmic contact with the source contact 54. The gate shield 66 is another feature that makes the high-side FET 32 more amenable to high power applications. By biasing the gate shield 66 to a given voltage, high power signals on drain contact 56 are shielded from having an appreciable effect on the gate region. Although the gate shield 66 is illustrated as being ohmically coupled to the source contact 54, the gate shield 66 can also be independently biased. In some examples, the gate shield 66 and the source contact 54 can be formed in two different steps and can comprise two different kinds of material. In this case, however, such features are inconsequential to the operation of the device in most situations because the gate shield 66 and the source contact 54 are one contiguous region of highly conductive material with an uninterrupted ohmic contact from above dielectric material 74 all the way to the surface of active layer 42. As such, the combination of the gate shield 66 and the source contact 54 can be conceptualized as a single source contact.

In general, the source contact 54 and the drain contact 56 enable electrical connections to the high-side LDFET 32 from other circuitry that may or may not be integrated with the LDFET on the same integrated circuit. Source region 46 can be electrically coupled to source contact 54 via a silicide layer formed on the surface of source region 46. More generally, the source region 46 can be coupled to the source contact 54 using any process that forms an ohmic or non-rectifying contact between the two regions of the structure.

The connection between the drain contact 56 and the drain region 52 can comprise any of the variations described above with reference to source contact 54 and source region 46. The source contact 54 and the drain contact 56 can comprise a metal, metal alloy, metal silicide, or an electrically conductive semiconductor material such as doped polysilicon. Example metals, metal alloys, and metal silicides can each comprise copper, tungsten, molybdenum, and aluminum.

In the example shown in FIG. 2, some of the elements of the low-side LDFET portion 34 of the active layer 42 function in similar ways as the corresponding elements of the high-side LDFET portion 32 of the active layer 42. In this regard, the functionally similar elements of the low-side LDFET 34 will be labeled with reference numbers of the corresponding elements of the high-side LDFET that are followed by an apostrophe. For example, the drain region of the low-side LDFET 34 that corresponds to the functionally similar drain region 52 of the high-side LDFET 32 is labeled with reference number 52'. Thus, the low-side LDFET 34 includes the following elements: source region 46', doped region 48', LDD region 50' with a heavier doped extension region 49' that are formed in a doped region 51', drain region 52', source contact 54', drain contact 56', body region 60', deep well region 62', gate shield 66', gate electrode 68', and dielectric material 70', 72'.

In this example, the source contact 54' of the low-side LDFET 34 not only extends from above the active layer 42, through the source and doped regions 46', 48' to the deep well region 62', but it also extends through the deep well region 62' and the buried dielectric layer 44 and into the substrate 45. In this way, the source contact 54' of the low-side LDFET 34 provides a source-down electrical connection to the substrate 45 and thereby to the substrate contact 40, which corresponds to the ground node for the high power semiconductor switch circuit 10.

The phase node contact 38 electrically interconnects the source contact 54 of the high-side LDFET with the drain contact 56' of the low-side LDFET and, thereby, forms a common node for the source region 46 of the high-side LDFET 32 and the drain region 52' of the low-side LDFET 34. It is noted that the buried dielectric layer 44 and the dielectric isolation barrier 47 electrically isolate the high-side LDFET 32 from the substrate 45 to prevent the formation of a common node with the source contact 54' of the low-side LDFET 34 during operation of the power switch circuit 10.

As mentioned above, reconfiguring one of the three front-side source, drain, and phase node contacts in a conventional implementation of the power switch circuit 10 as a substrate contact frees up physical space on the front-side of the semiconductor die for high performance electrical connections to the two remaining front-side contacts. This feature increases circuit design flexibility, performance, and manufacturability of integrated lateral power device circuits.

Figure 3:
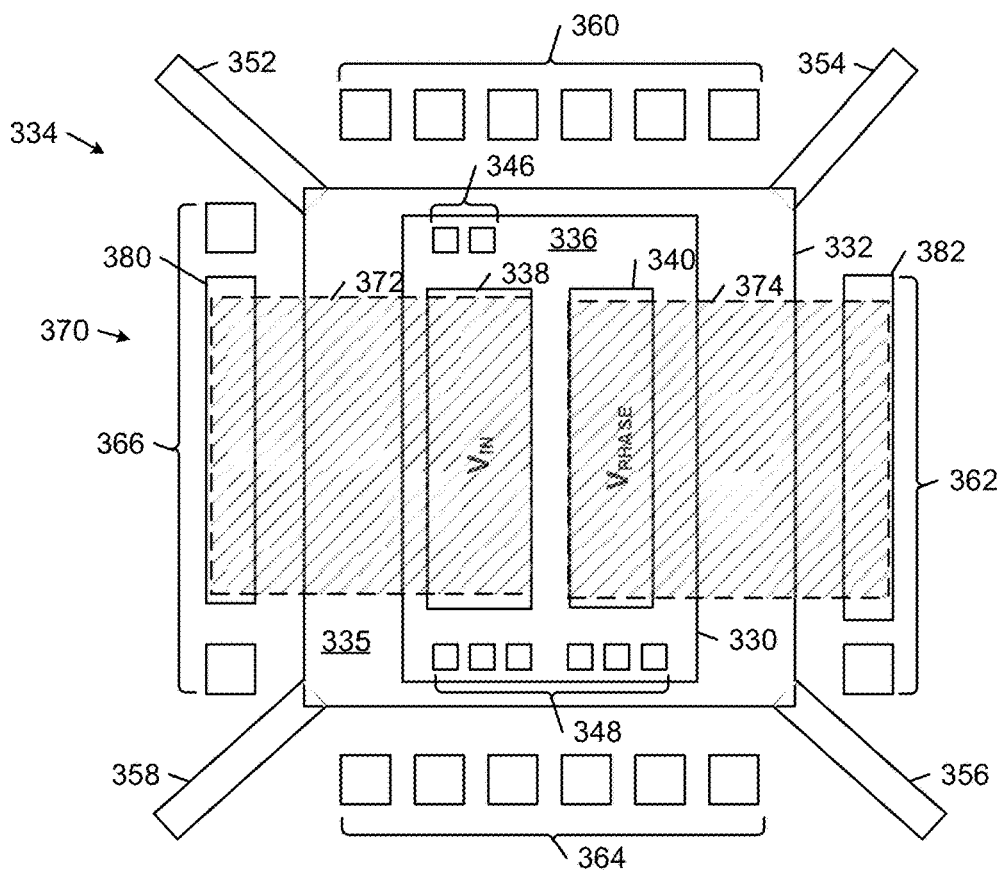
FIG. 3 is a diagrammatic top orthographic view of an example of a conductive clip arrangement electrically connecting die pads on a semiconductor die to a leadframe structure, in accordance with some embodiments.

FIG. 3 shows a diagrammatic top orthographic view of an example of a semiconductor die 330 embodying an example implementation of the high power semiconductor switch circuit 10 shown in FIG. 2. The semiconductor die 330 is bonded to a paddle 332 portion of a leadframe structure 334. In the illustrated example, the paddle 332 has a rectangular top surface 335 that is bordered by four sides. The semiconductor die 330 is attached to the paddle 332 by a die-attach adhesive or by material, such as a solder paste or sintered silver. In some examples, the substrate contact 40 may be electrically coupled to an electrical terminal of the leadframe structure 334 by the paddle 332 itself or an electrical conductor on or extending through the paddle 332. The semiconductor die 330 includes a top surface 336 on which a number of die pads 338, 340, 346, and 348 are provided. In the illustrated example, the die pads 338 and 340, respectively, correspond to the $V_{IN}$ and $V_{PHASE}$ terminals 36, 38 of the high power semiconductor switch circuit shown in FIG. 2, the die pads 346 correspond to the driver input terminals 18, 20, and the die pads 348 correspond to other input/output terminals. The leadframe structure 334 also includes a set of four tie bars 352, 354, 356, 358 that attach the corners of the paddle 332 to the semiconductor package, and four sets 360, 362, 364, 366 of perimeter package leads. The die pads 346, 348 typically are connected to respective ones of the perimeter package leads 360, 364 by bond wires.

FIG. 3 also shows an example of a conductive clip arrangement 370 that electrically connects the die pads 338, 340 on the semiconductor die 330 to the leadframe structure 334. The conductive clip arrangement 370 includes a first electrically conductive clip 372 and a second electrically conductive clip 374. The first electrically conductive clip 372 electrically connects the die pad 338 ($V_{IN}$) to a perimeter package lead 380 (in the perimeter package lead set 366), which corresponds to the terminal 22 in the circuit shown in FIG. 1. The second electrically conductive clip 374 electrically connects the die pad 340 ($V_{PHASE}$) to a perimeter package lead 382 (in the perimeter package lead set 362), which corresponds to the node 16 in the high power semiconductor switch circuit 10 shown in FIG. 1. As shown, the two rectangular conductive clips 372, 374 can be mechanically connected across the die pads 338, 340 and the package leads 380, 382 in a straightforward way while maintaining substantial freedom to optimize the dimensions of the clips to meet desired current carrying capacity, resistance, and/or inductance specifications. The presence of a third front-side conductive clip, however, would impose significant constraints on the ability to optimally arrange the conductive clips on the front-side of the die for manufacturability and on the freedom to optimize the current carrying capacity, resistance, and/or inductance properties of the electrically conductive clips.

In the example implementation of the high power semiconductor switch circuit 10 described above and shown in FIG. 2, the drain contact 56 of the high-side LDFET 32 is connected to the input node 22, the source contact 54 of the high-side LDFET 32 and the drain contact 56' of the low-side LDFET 34 are both connected to the phase node 16, and the source contact 54' of the low-side LDFET 34 is connected to the ground node. As mentioned above, other node connection arrangements are possible. For example, these other connection arrangements include any connection arrangements between a first LDFET and a second LDFET that includes (i) a common node that electrically connects to a source of a first LDFET and a drain of a second LDFET, (ii) at least one of the drain of the first LDFET, the source of the second LDFET, and the common node is electrically connected to the semiconductor substrate, and (iii) first and second front-side contacts that are respectively connected to the ones of the drain of the first LDFET, the source of the second LDFET, and the common node that are not electrically connected to the semiconductor substrate.

Figure 4:
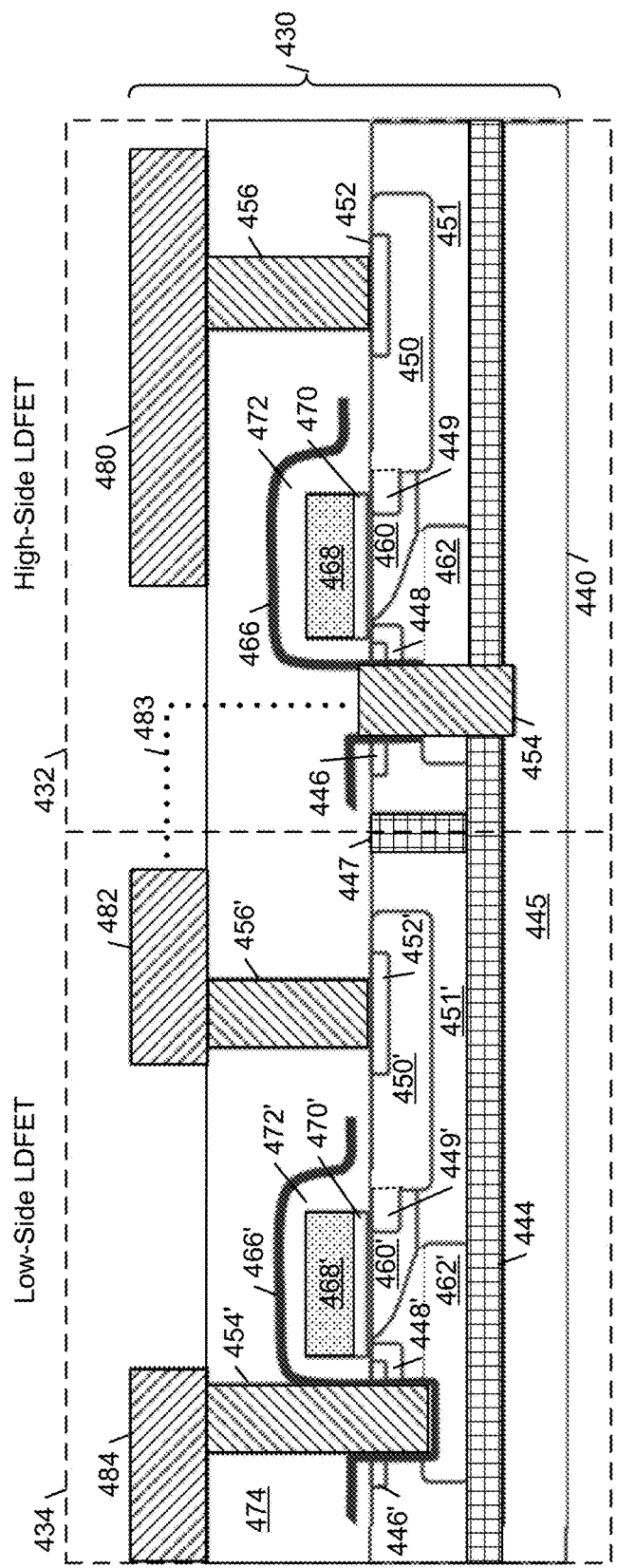
FIG. 4 is a diagrammatic cross-sectional side view of an example of an integrated LDFET circuit, in accordance with some embodiments.

FIG. 4 shows a diagrammatic cross-sectional side view of an example of a semiconductor die 430 embodying the high power semiconductor switch circuit 10 of FIG. 1. In one example configuration, a first front-side contact 480 of the high-side LDFET 432 corresponds to the input node 22 of the switch circuit 10 (see FIG. 1), a substrate contact 440 corresponds to the phase node 16 of the switch circuit 10, and a second front-side contact 484 corresponds to the ground node of the switch circuit 10.

In this example, some of the elements of the high-side LDFET 32 of the semiconductor die 30 shown in FIG. 2 function in similar ways as the corresponding elements of the high-side LDFET 432 shown in FIG. 4. In this regard, the functionally similar elements of the high-side LDFET 432 of FIG. 4 are labeled with the reference numbers of the corresponding elements of the high-side LDFET of FIG. 2 preceded by the number "4". For example, the drain region of the high-side LDFET 432 of FIG. 4 that corresponds to the functionally similar drain region 52 of the high-side LDFET 32 of FIG. 2 is labeled with reference number "452". Thus, the high-side LDFET 432 includes the following elements: source region 446, doped region 448, LDD region 450 with a heavier doped extension region 449 that are formed in a doped region 451, drain region 452, source contact 454, drain contact 456, body region 460, deep well region 462, gate shield 466, gate electrode 468, and dielectric material 470, 472. In addition, the functionally similar elements of the low-side LDFET 434 are labeled with the reference numbers of the corresponding elements of the high-side LDFET 432 followed by an apostrophe. Thus, the low-side LDFET 434 includes the following elements: source region 446', doped region 448', LDD region 450' with a heavier doped extension region 449' that are formed in a doped region 451', drain region 452', source contact 454', drain contact 456', body region 460', deep well region 462', gate shield 466', gate electrode 468', and dielectric material 470', 472'.

In this example, the drain contact 456' of the low-side LDFET 434 and the source contact 454 of the high-side LDFET 432 are electrically connected by an electrical conductor 482 that includes an out-of-plane portion 483. In addition, the source contact 454 of the high-side LDFET 432 not only extends from above the active layer, through the source and doped regions 446, 448 to the deep well region 462, but it also extends through the deep well region 462 and the buried dielectric layer 444 and into the wafer substrate 445. In this way, the source contact 454 of the high-side LDFET 432 provides a source-down electrical connection to the substrate 445 and thereby to the substrate contact 440 for the phase node 16 of the high power semiconductor switch circuit 10. It is noted that the buried dielectric layer 444 and the dielectric isolation barrier 447 electrically isolate the low-side LDFET 434 from the substrate 445 to prevent the formation of a common node with the source contact 454 of the high-side LDFET 432 during operation of the power switch circuit.

Figure 5:
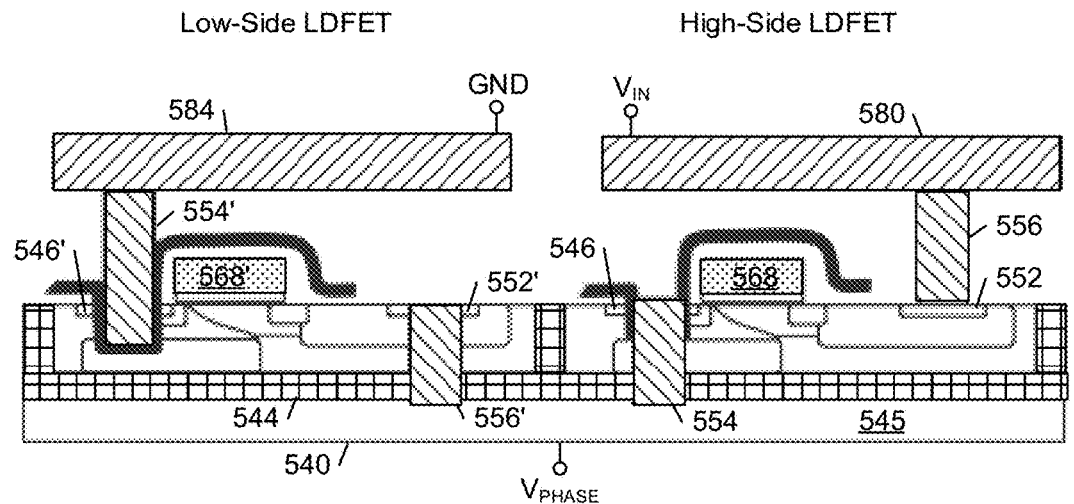
FIG. 5 is a diagrammatic cross-sectional side view of an example of an integrated LDFET circuit, in accordance with some embodiments.

FIG. 5 shows a diagrammatic cross-sectional side view of an example of a semiconductor die embodying the high power semiconductor switch circuit 10 of FIG. 1. In one example, a first front-side contact 580 of the high-side LDFET is connected to the input node ($V_{IN}$) of the switch circuit 10 (see FIG. 1), a substrate contact 540 is connected to the phase node 16 ($V_{PHASE}$) of the switch circuit 10, a second front-side contact 584 is connected to the ground node (GND) of the switch circuit 10. The substrate contact 540 corresponds to the phase node of the switch circuit 10.

In this example, some of the elements of the high-side LDFET 32 of the semiconductor die 30 shown in FIG. 2 function in similar ways as the corresponding elements of the high-side LDFET shown in FIG. 5. In this regard, the functionally similar elements of the high-side LDFET of FIG. 5 are labeled with the reference numbers of the corresponding elements of the high-side LDFET of FIG. 2 preceded by the number "5". For example, the drain region of the high-side LDFET of FIG. 5 that corresponds to the functionally similar drain region 52 of the high-side LDFET 32 of FIG. 2 is labeled with reference number "552". Thus, the high-side LDFET includes the following elements: source region 546, drain region 552, source contact 554, drain contact 556, and gate electrode 568. In addition, the functionally similar elements of the low-side LDFET are labeled with the reference numbers of the corresponding elements of the high-side LDFET followed by an apostrophe. Thus, the low-side LDFET shown in FIG. 5 includes the following elements: source region 546', drain region 552', source contact 554', drain contact 556', and gate electrode 568'.

In this example, using a process that supports formation of both source and drain substrate contacts, both the high-side source contact 554 and low-side drain contact 556' are fabricated as substrate contacts that extend through the buried dielectric layer 544 to the substrate 545. Thus, instead of using a front-side contact to connect the high-side source region 546 to the low-side drain region 552' as in the example shown in FIG. 4, this implementation of the high power semiconductor switch circuit 10 uses two substrate contacts 554 and 556' to connect the high-side source region 546 and the low-side drain region 552' to the phase node ($V_{PHASE}$). In this way, the number of front-side connections is reduced from three to two.

Figure 6:
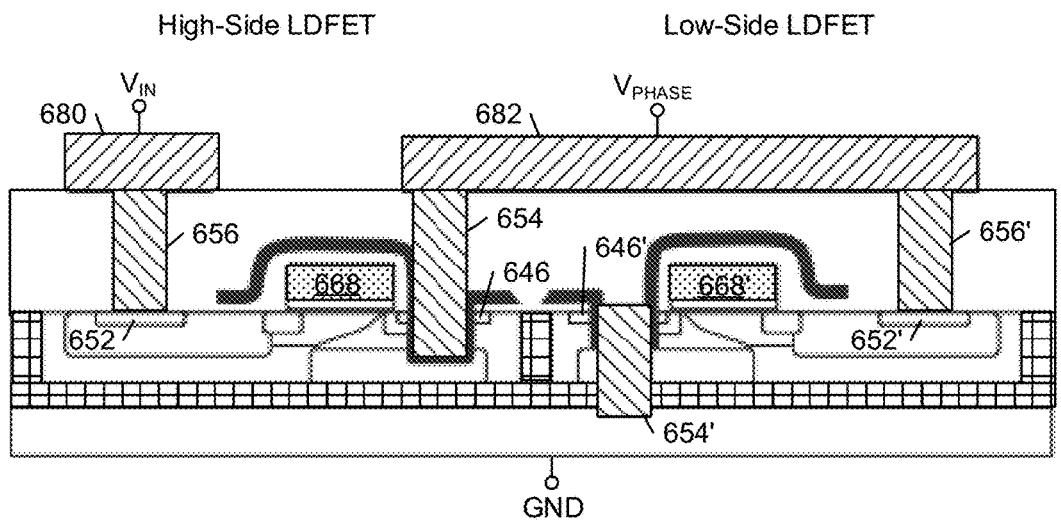
FIG. 6 is a diagrammatic cross-sectional side view of an example of an integrated LDFET circuit, in accordance with some embodiments.

FIG. 6 shows a diagrammatic cross-sectional side view of an example of a semiconductor die embodying the high power semiconductor switch circuit 10 of FIG. 1. In one example configuration, a first front-side contact 680 of the high-side LDFET is connected to the input node ($V_{IN}$) of the switch circuit 10 (see FIG. 1), a second front-side contact 682 is connected to the phase node ($V_{PHASE}$) of the switch circuit 10, and a substrate contact 654' is connected to the ground node (GND) of the switch circuit 10.

In this example, some of the elements of the high-side LDFET 32 of the semiconductor die 30 shown in FIG. 2 function in similar ways as the corresponding elements of the high-side LDFET shown in FIG. 6. In this regard, the functionally similar elements of the high-side LDFET of FIG. 6 are labeled with the reference numbers of the corresponding elements of the high-side LDFET of FIG. 2 preceded by the number "6". For example, the drain region of the high-side LDFET of FIG. 6 that corresponds to the functionally similar drain region 52 of the high-side LDFET 32 of FIG. 2 is labeled with reference number "652". Thus, the high-side LDFET includes the following elements: source region 646, drain region 652, source contact 654, drain contact 656, and gate electrode 668. In addition, the functionally similar elements of the low-side LDFET are labeled with the reference numbers of the corresponding elements of the high-side LDFET followed by an apostrophe. Thus, the low-side LDFET shown in FIG. 6 includes the following elements: source region 646', drain region 652', source contact 654', drain contact 656', and gate electrode 668'.

In this example, the high-side source region 646 is connected to the low-side drain region 652' by the second front-side connection 682, which extends over the low-side source region 646', which is connected to ground node of the switch circuit 10 through a substrate contact. This example illustrates how the use of a substrate contact increases the amount of front-side space available and thereby increases the interconnect options that are available to a circuit designer.

Figures 7A, 7B:
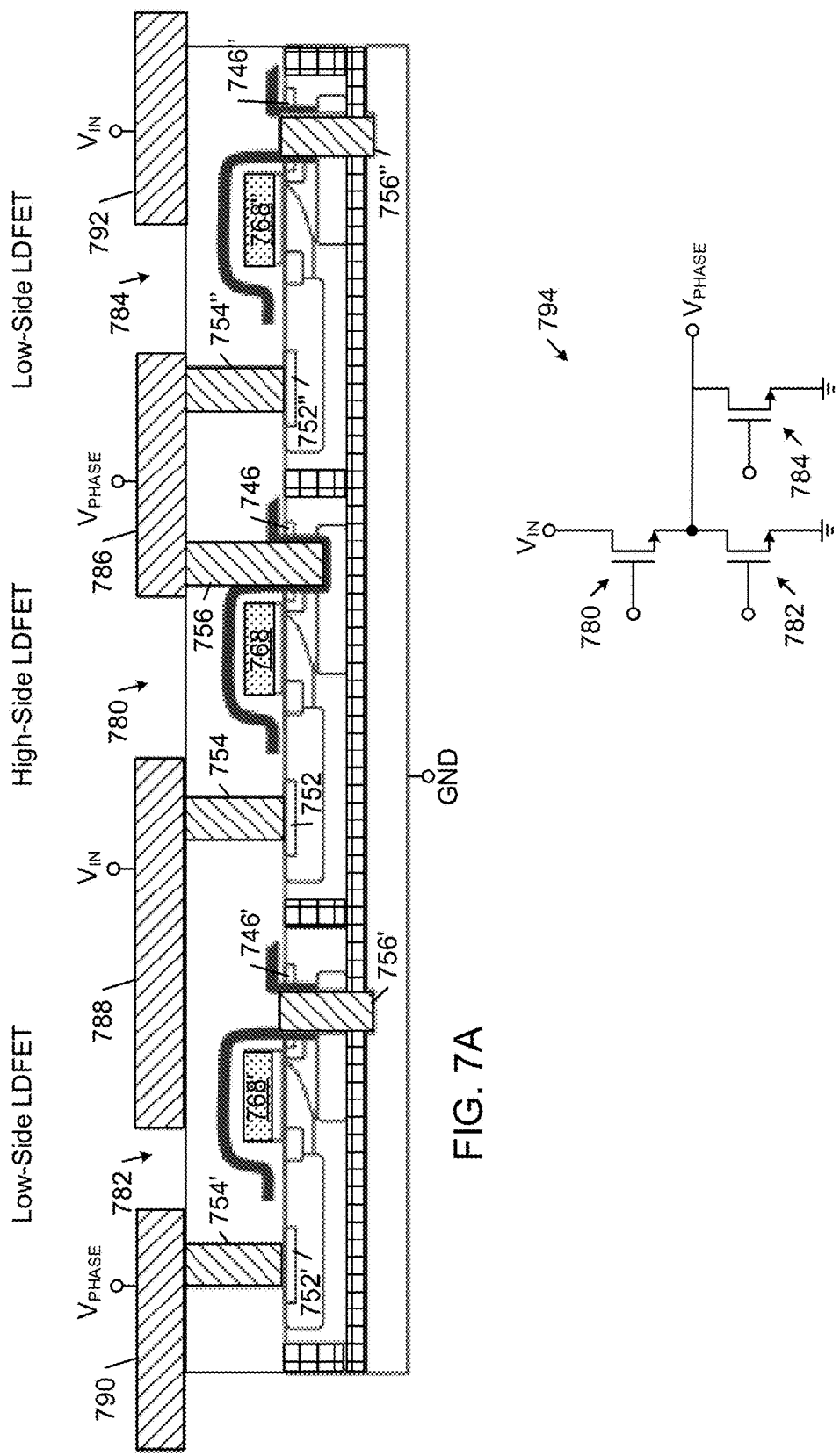
FIG. 7A is a diagrammatic cross-sectional side view of an example of an integrated LDFET circuit, in accordance with some embodiments.
FIG. 7B is a circuit diagram of an example of a high power semiconductor switch incorporating some embodiments.

FIG. 7A shows a diagrammatic cross-sectional side view of an example of a semiconductor die embodying the high power semiconductor switch circuit that includes one high-side LDFET 780 and two low-side LDFETs 782 and 784. In one example configuration, a first front-side contact 786 connects a source contact 756 of the high-side LDFET 780 and a drain contact 754" of the low-side LDFET 784 to the phase node ($V_{PHASE}$) of the switch circuit 10 (see FIG. 1), a second front-side contact 788 connects a drain contact 754 of the high-side LDFET 780 to the input node ($V_{IN}$) of the switch circuit 10, a third front-side contact 790 connects a drain contact 754' to the phase node ($V_{PHASE}$), and a fourth front-side contact 792 connects a drain contact of a fourth high-side LDFET (not shown) to the input node ($V_{IN}$) of the switch circuit 10. FIG. 7B shows a circuit diagram 794 of the interconnections between the high-side LDFET 780 and the two low-side LDFETs 782 and 784.

In this example, some of the elements of the high-side LDFET 32 of the semiconductor die 30 shown in FIG. 2 function in similar ways as the corresponding elements of the high-side LDFET 780 shown in FIG. 7A. In this regard, the functionally similar elements of the high-side LDFET 780 of FIG. 7A are labeled with the reference numbers of the corresponding elements of the high-side LDFET of FIG. 2 preceded by the number "7". For example, the drain region of the high-side LDFET 780 of FIG. 7A that corresponds to the functionally similar drain region 52 of the high-side LDFET 32 of FIG. 2 is labeled with reference number "752". Thus, the high-side LDFET 780 includes the following elements: source region 746, drain region 752, drain contact 754, source contact 756, and gate electrode 768. In addition, the functionally similar elements of the low-side LDFET 782 are labeled with the reference numbers of the corresponding elements of the high-side LDFET followed by an apostrophe. Thus, the low-side LDFET 782 shown in FIG. 7A includes the following elements: source region 746', drain region 752', drain contact 754', source contact 756', and gate electrode 768'. Similarly, the functionally similar elements of the low-side LDFET 784 are labeled with the reference numbers of the corresponding elements of the high-side LDFET followed by a double apostrophe. Thus, the low-side LDFET 784 shown in FIG. 7A includes the following elements: source region 746", drain region 752", drain contact 754", source contact 756", and gate electrode 768".

In this example, the high-side source region 746 and the adjacent low-side drain region 752" are interconnected by the first front-side contact 786 and the high-side source contact 756 and the low-side drain contact 754". By using substrate contacts 756' and 756" for connecting the source regions 746' and 746", respectively, to the ground node (GND), a larger metal area is available for the front-side phase node contact 790 for the low-side drain region 752' to enable the out-of-plane resistance to be reduced.

Numerous variations in the structures and arrangements of the constituent LDFETs that can be used to implement integrated LDFET devices are possible. The following disclosure describes individual LDFET structures that can replace one or both of the constituent LDFETs of the integrated LDFET circuits shown in FIGS. 2 and 4 to create different integrated LDFET circuit embodiments. In addition, two or more of these individual LDFET structures may be combined with one another to create additional integrated LDFET circuit embodiments. Each of the following individual LDFET structures includes elements that are functionally similar to elements of the high-side LDFET 32 shown in FIG. 2. For ease of comprehension, the functionally similar elements of the individual LDFET structures are labeled with the same reference numbers of the corresponding elements of the high-side LDFET 32 followed by two apostrophes.

Figure 8A:
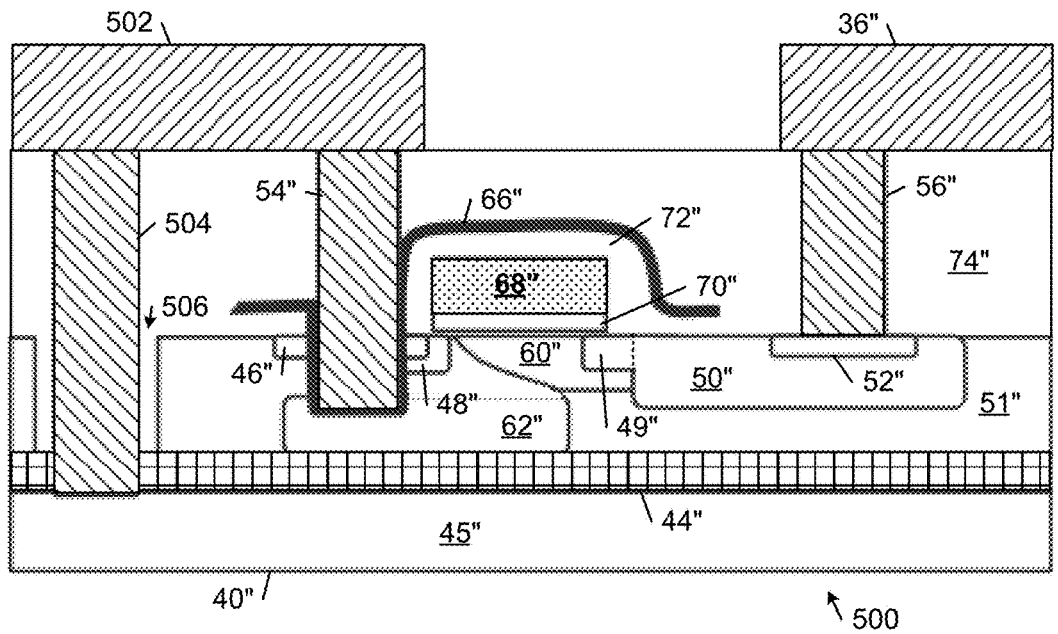
FIG. 8A is a diagrammatic cross-sectional side view of an example of a LDFET structure, in accordance with some embodiments.

FIG. 8A shows a diagrammatic cross-sectional side view of an example of a LDFET 500 in a source-down configuration. The LDFET 500 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the deep well 62" as described above in connection with the source contact 54' of the low-side LDFET 34 example shown in FIG. 2, the source contact 54" shown in FIG. 8A includes a front-side contact 502 that is connected to a substrate contact 504 that extends through an opening 506 in the active layer and further extends through the buried dielectric layer 44" to the substrate 45". In some examples, the opening 506 in the active layer allows the substrate contact through the buried dielectric layer 44" to be made using an oxide etch process and does not require a silicon etch process.

Figure 8B:
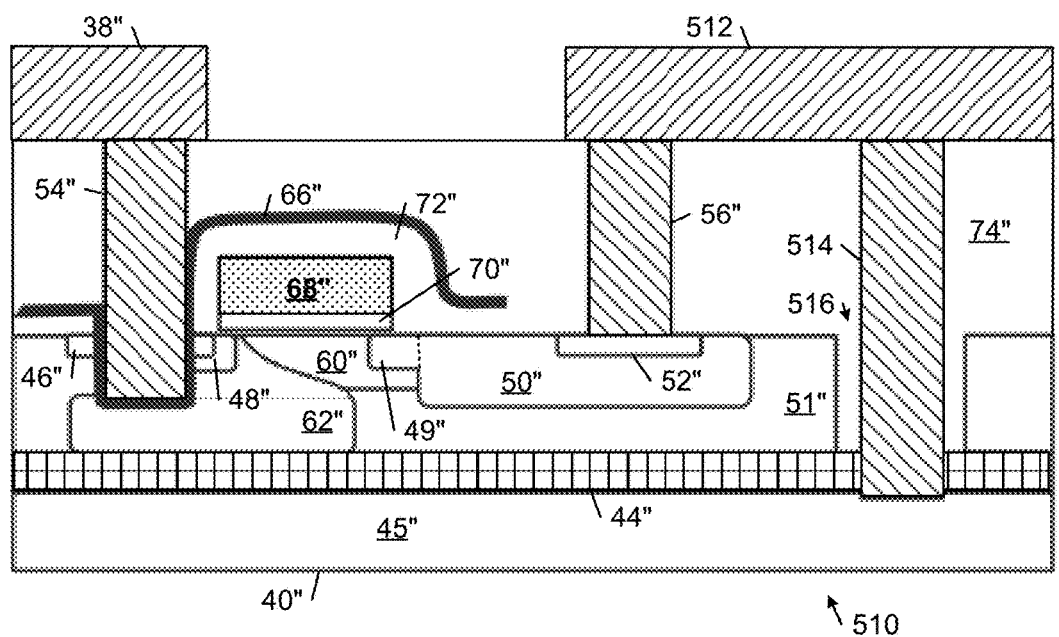
FIG. 8B is a diagrammatic cross-sectional side view of an example of a LDFET structure, in accordance with some embodiments.

FIG. 8B shows a diagrammatic cross-sectional side view of an example of a LDFET 510 in a drain-down configuration. The LDFET 510 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the drain and LDD regions 52", 50", the drain contact 56" includes a front-side contact 512 that is connected to a substrate contact 514 that extends through an opening 516 in the active layer and further extends through the buried dielectric layer 44" to the substrate 45". In some examples, the opening 516 in the active layer allows the substrate contact 514 through the buried dielectric layer 44" to be made using an oxide etch process and does not require a silicon etch process.

Figure 9A:
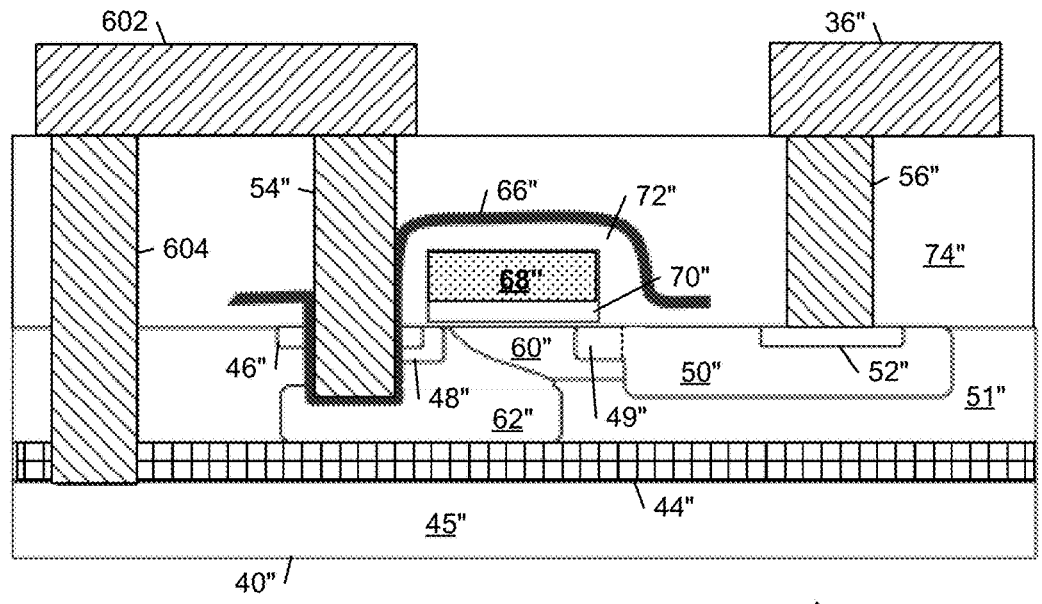
FIG. 9A is a diagrammatic cross-sectional side view of an example of a LDFET structure, in accordance with some embodiments.

FIG. 9A shows a diagrammatic cross-sectional side view of an example of a LDFET 600 in a source-down configuration. The LDFET 600 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the deep well 62 as described above in connection with the source contact 54' of the low-side LDFET 34 example shown in FIG. 2, the source contact 54" includes a front-side contact 602 that is connected to a substrate contact 604 that extends through the active layer and further extends through the buried dielectric layer 44" to the substrate 45". In some examples, etching the substrate contact through the active layer may eliminate a contact-to-active spacing design rule, decreasing transistor pitch.

Figure 9B:
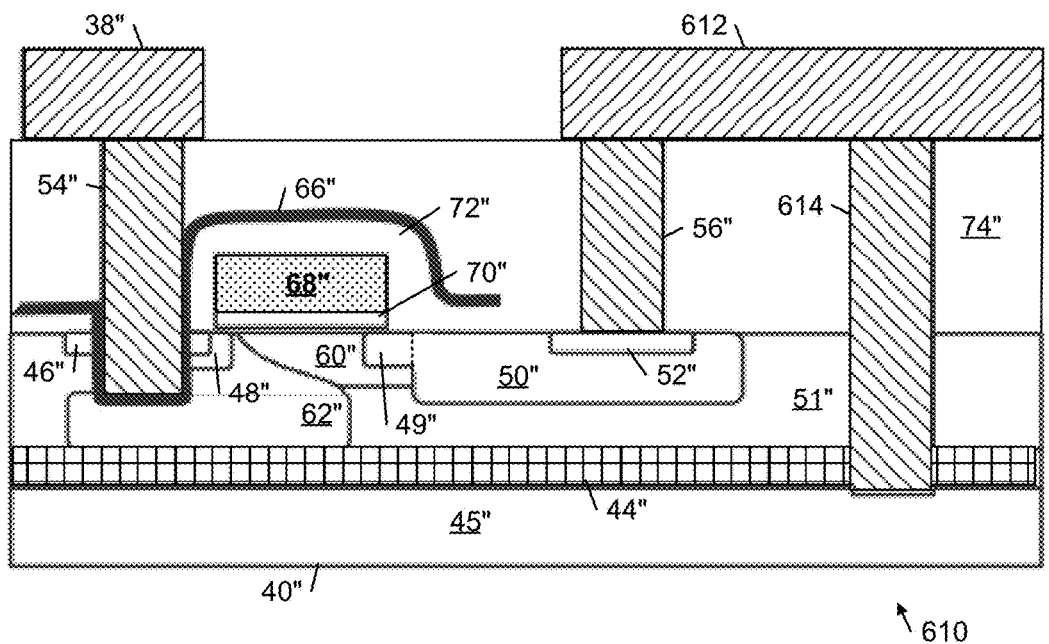
FIG. 9B is a diagrammatic cross-sectional side view of an example of a LDFET structure, in accordance with some embodiments.

FIG. 9B shows a diagrammatic cross-sectional side view of an example of a LDFET 610 in a drain-down configuration. The LDFET 610 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, instead of extending through the drain and LDD regions 52", 50", the drain contact 56" includes a front-side contact 612 that is connected to a substrate contact 614 that extends through the active layer and further extends through the buried dielectric layer 44" to the substrate 45". In some examples, etching the substrate contact through the active layer may eliminate a contact-to-active spacing design rule, decreasing transistor pitch.

Figure 10A:
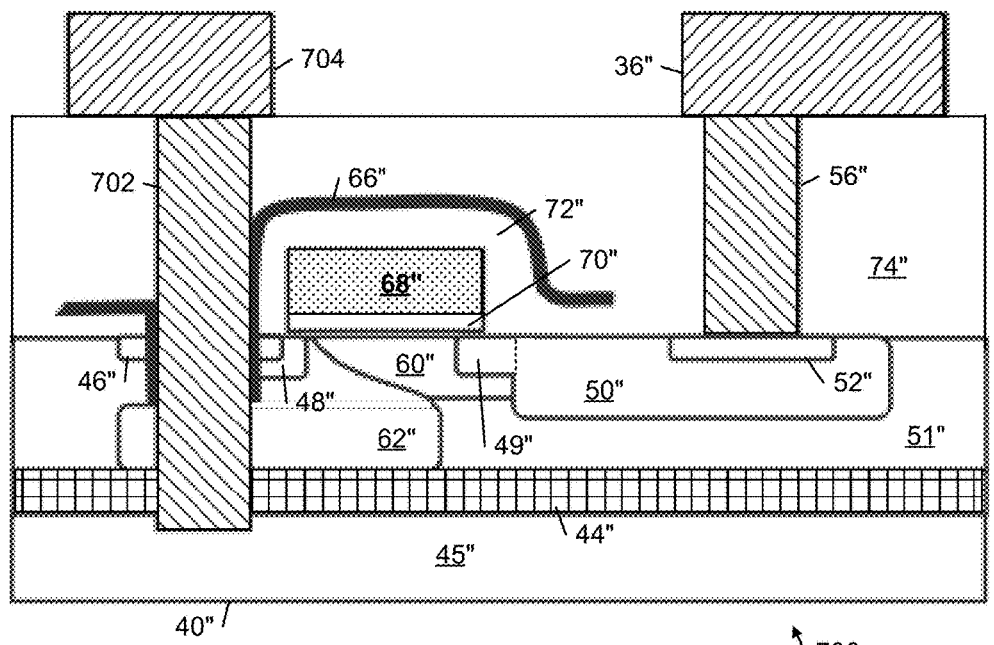
FIG. 10A is a diagrammatic cross-sectional side view of an example of a LDFET structure, in accordance with some embodiments.

FIG. 10A shows a diagrammatic cross-sectional side view of an example of a LDFET 700 in a source-down configuration. The LDFET 700 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, in addition to extending from above the active layer to the semiconductor die substrate 45" as described above in connection with the source contact 54' of the low-side LDFET 34 example shown in FIG. 2, the source contact 702 also extends upward through the electrically insulating material 74" to a front-side contact 704.

Figure 10B:
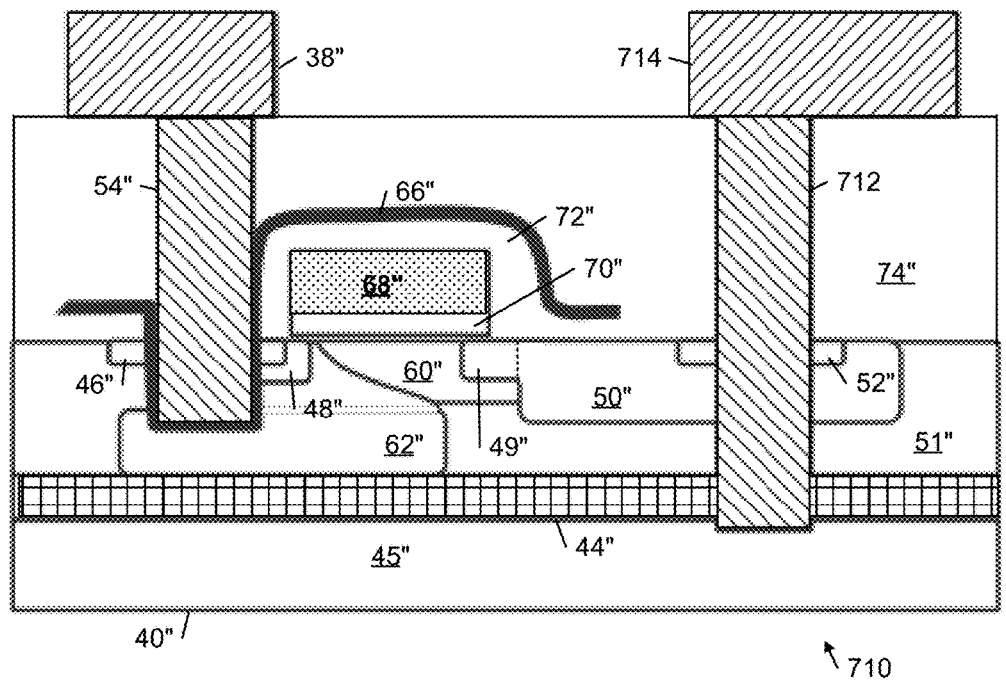
FIG. 10B is a diagrammatic cross-sectional side view of an example of a LDFET structure, in accordance with some embodiments.

FIG. 10B shows a diagrammatic cross-sectional side view of an example of a LDFET 710 in a drain-down configuration. The LDFET 710 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, a drain contact 712 extends upward from the substrate 45", through the doped, LDD, drain, and electrically insulating material regions 51", 50", 52", 74" to a front-side contact 714.

Figure 11A:
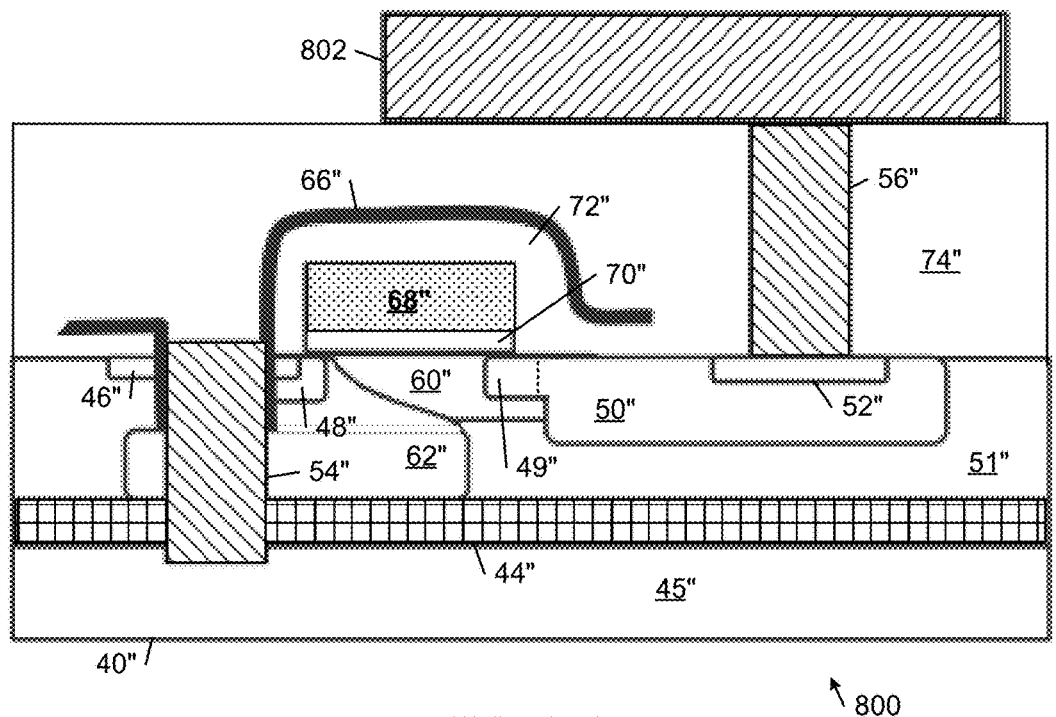
FIG. 11A is a diagrammatic cross-sectional side view of an example of a LDFET structure, in accordance with some embodiments.

FIG. 11A shows a diagrammatic cross-sectional side view of an example of a LDFET 800 in a source-down configuration. The LDFET 800 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, the source contact 54" does not require any metal 1 connections, as described above with respect to the source contact 54' of the low-side LDFET 34 example shown in FIG. 2. For this reason, the front-side contact 802 can be laid out without regard to the location of the source contact 54". In this example, the metal 1 front-side contact 802 may overlie the source contact 54" or not, depending on circuit design requirements.

Figure 11B:
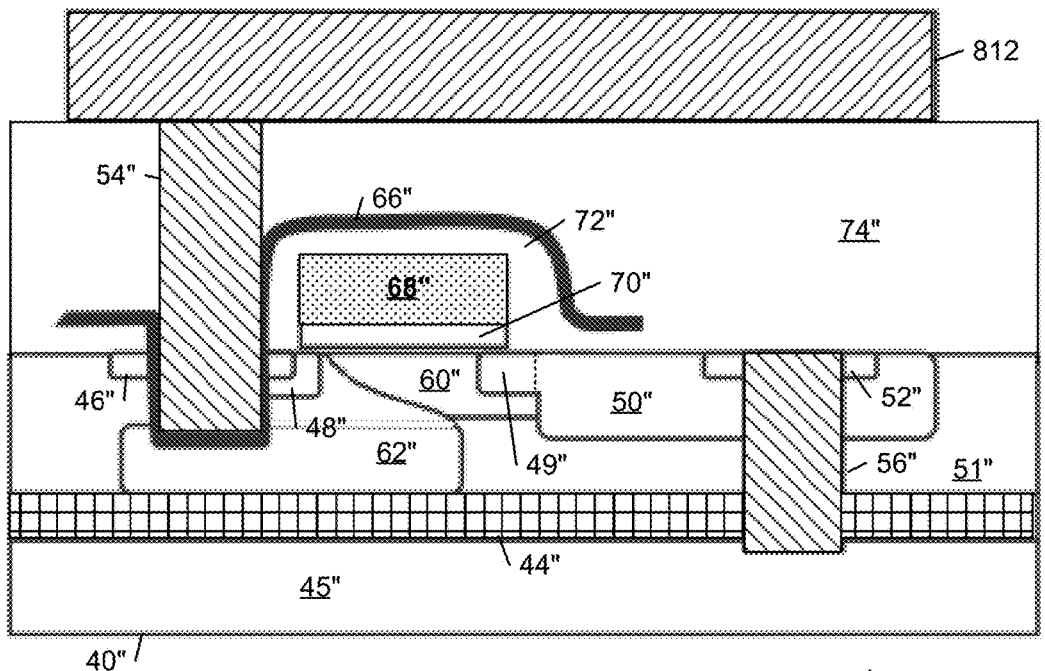
FIG. 11B is a diagrammatic cross-sectional side view of an example of a LDFET structure, in accordance with some embodiments.

FIG. 11B shows a diagrammatic cross-sectional side view of an example of a LDFET 810 in a drain-down configuration. The LDFET 810 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". In this example, the drain contact 56" does not require a metal 1 connection. For this reason, the front-side contact 812 can be laid out without regard to the location of the drain contact 56". For example, the metal 1 contact 802 may overlie the drain contact 56" or not, depending on circuit design requirements.

Figure 12A:
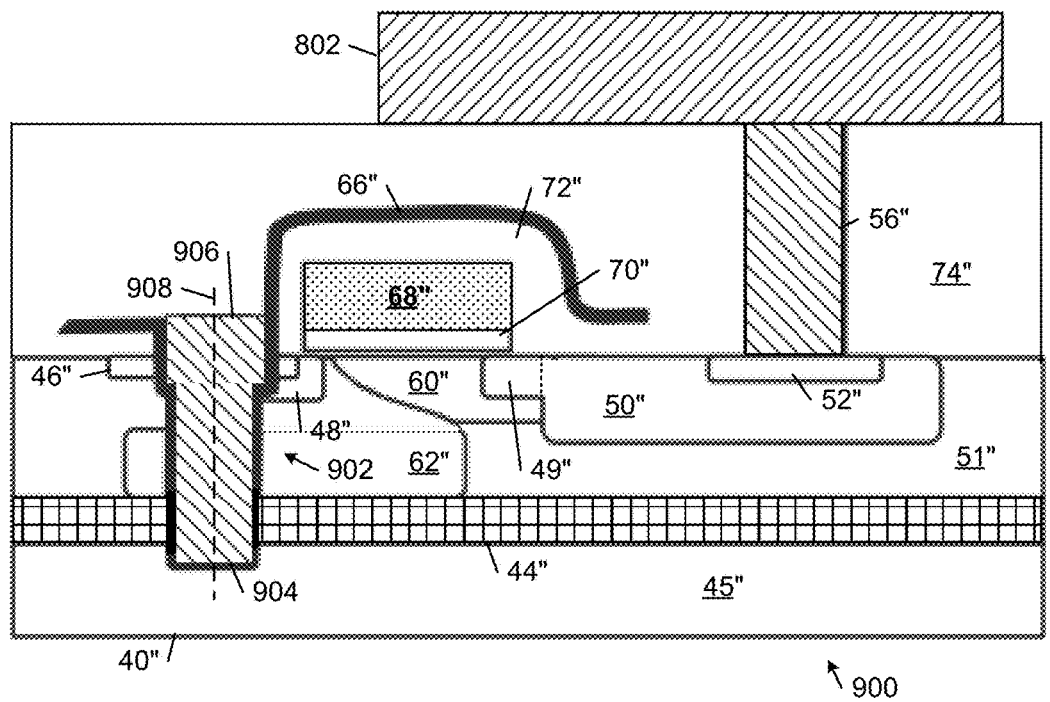
FIG. 12A is a diagrammatic cross-sectional side view of an example of a LDFET structure, in accordance with some embodiments.

FIG. 12A shows a diagrammatic cross-sectional side view of an example of a LDFET 900 in a source-down configuration. The LDFET 900 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". This example corresponds to the LDFET 800 shown in FIG. 11A, except that it includes a source contact 902 with a relatively narrow bottom portion 904 and a wider top shelf portion 906 that reduces the contact resistance to the source region 46". In particular, the source contact 902 extends through the active layer to the substrate 45" along an axial dimension 908, the top shelf portion 906 extends into the active layer and is characterized by a first width in a lateral dimension orthogonal to the axial dimension 908, and the bottom portion 904 extends through the active layer to the substrate 45" and is characterized by a second width in the lateral dimension that is smaller than the first width.

In some examples, the source contact 902 is formed by performing a shallow wide contact etch, followed by a second deep narrow contact etch.

In some examples, the resistance of the source contact 902 can be further reduced by implanting the source 46" after the first shallow wide contact etch is performed.

In some examples, the resistance between the source contact 902 and the body can be further reduced by forming the shelf portion 906 at a deeper location within the deep well region 62". This approach may be combined with a heavy implant to the deep well region 62" after the second deep narrow contact etch is performed.

In the illustrated example, the gate shield 66" is deposited after the second deep narrow contact etch is performed. In other examples, the gate shield 66" is deposited after the first shallow wide contact etch is performed.

In some examples, after the deep narrow contact etch is performed, the substrate 45" is implanted through the opening formed by the deep narrow contact etch with a heavy implant of the same dopant type of the substrate 45" (e.g., p+ implant if the substrate is p-type) to improve substrate contact resistance.

Figure 12B:
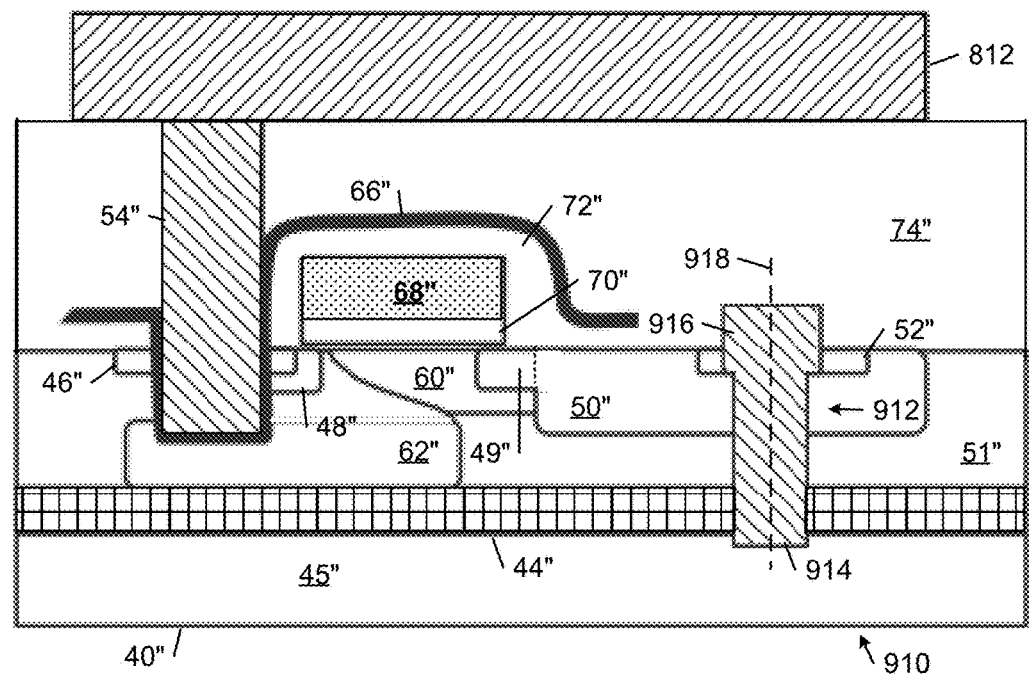
FIG. 12B is a diagrammatic cross-sectional side view of an example of a LDFET structure, in accordance with some embodiments.

FIG. 12B shows a diagrammatic cross-sectional side view of an example of a LDFET 910 in a drain-down configuration. The LDFET 910 includes the following elements: substrate contact 40", buried dielectric layer 44", substrate 45", source region 46", doped region 48", LDD region 50" with a heavier doped extension region 49" that are formed in a doped region 51", drain region 52", source contact 54", drain contact 56", body region 60", deep well region 62", gate shield 66", gate electrode 68", and dielectric material 70", 72", 74". This example corresponds to the LDFET 810 shown in FIG. 11B, except that it includes a drain contact 912 with a relatively narrow bottom portion 914 and a wider top shelf portion 916 that reduces the contact resistance to the drain region 52". In particular, the drain contact 912 extends through the active layer to the substrate 45" along an axial dimension 918, the top shelf portion 916 extends into the active layer and is characterized by a first width in a lateral dimension orthogonal to the axial dimension 918, and the bottom portion 914 extends through the active layer to the substrate 45", and is characterized by a second width in the lateral dimension that is smaller than the first width.

In some examples, the source contact 912 is formed by performing a shallow wide contact etch, followed by a second deep narrow contact etch. In other examples, the deep narrow contact etch is performed first, and then a wide oxide etch is performed to expose the drain region 52" at the surface of the active layer.

In some examples, the source-down and drain-down configurations of the LDFETs 900 and 910 may be combined to produce a single LDFET in which both the source region 46" and the drain region 52" are connected to the substrate 45".

The following disclosure describes examples of layout options for the individual LDFET structures shown in FIGS. 8A-12B.

Figure 13:
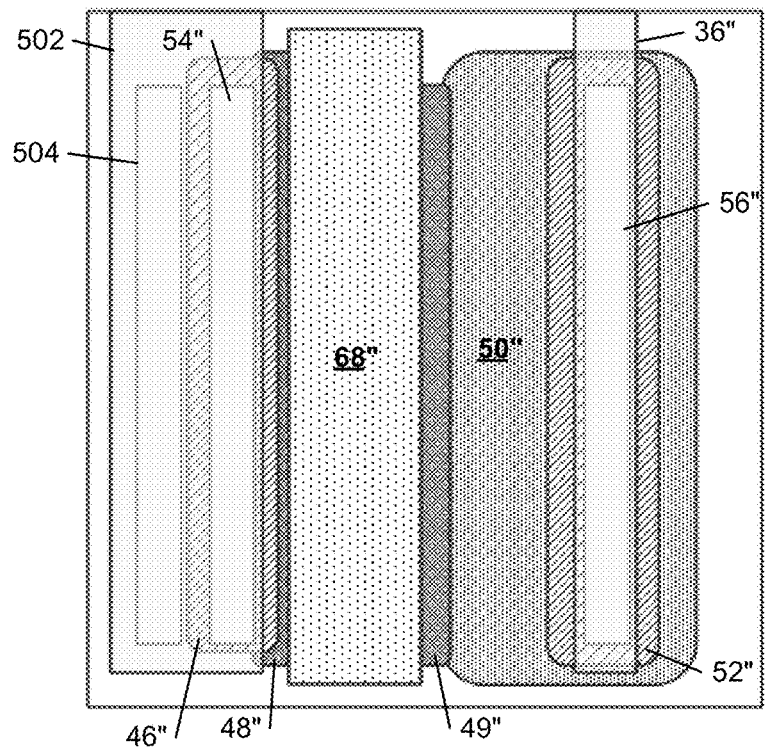
FIG. 13 is a diagrammatic top-down view of an example layout for the LDFET structures of FIGS. 8A and 9A, in accordance with some embodiments.

FIG. 13 shows a diagrammatic top-down view of an example layout for the source-down LDFET structure 500 of FIG. 8A in which the substrate contact 504 is displaced laterally from the source region 46". In this example, the front-side contact 502 electrically connects the source contact 54" to the substrate contact 504 that extends through the active layer and the buried dielectric layer to the substrate. As shown in FIG. 13, adding the substrate contact 504 adjacent to the source contact 54" increases the transistor pitch, thereby increasing the die area and cost. The example layout shown in FIG. 13 is equally applicable to the source-down LDFET structure 600 of FIG. 9A, e.g., with respect to the substrate contact 604 and the front-side contact 602. In addition, a horizontally reflected version of the layout shown in FIG. 13 can be used for the drain-down LDFET structures 510, 610 shown in FIGS. 8B and 9B, respectively.

Figure 14:
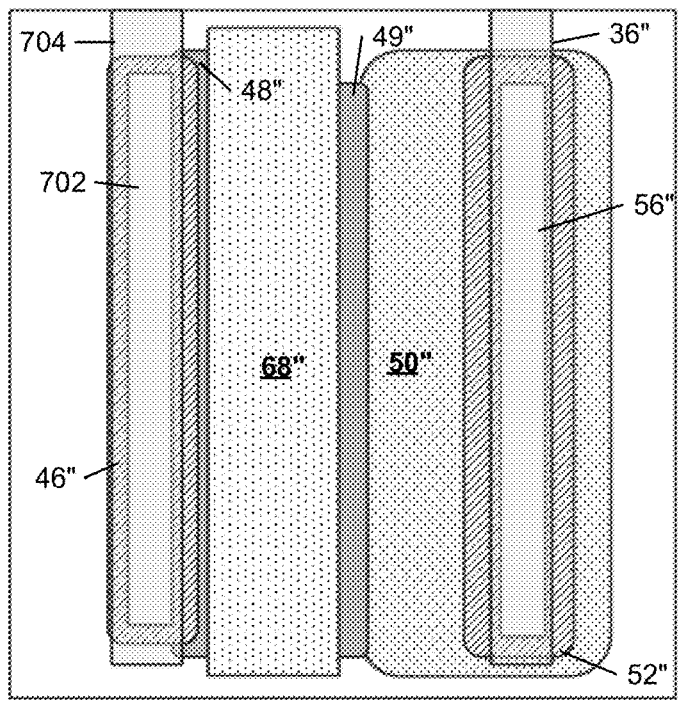
FIG. 14 is a diagrammatic top-down view of a first example layout for the LDFET structure of FIG. 10A, in accordance with some embodiments.

FIG. 14 shows a diagrammatic top-down view of a first example layout for the LDFET structure 700 of FIG. 10A in which the source contact 702 extends from the substrate 45", through the source 46", to the front-side contact 704. Thus, in cases in which the source contact 702 connects both the source region 46" and the substrate 45", die area and cost may be saved through the use of a single contact as compared with the approach shown in FIG. 13. In some examples, the source region 46" may be connected on the sides of the source contact 702. In some examples, a shelf can be created at the top of the source to improve source contact resistance (see, e.g., FIG. 12A). A horizontally reflected version of the layout shown in FIG. 14 can be used for the drain-down LDFET structure 710 shown in FIG. 10B.

Figure 15:
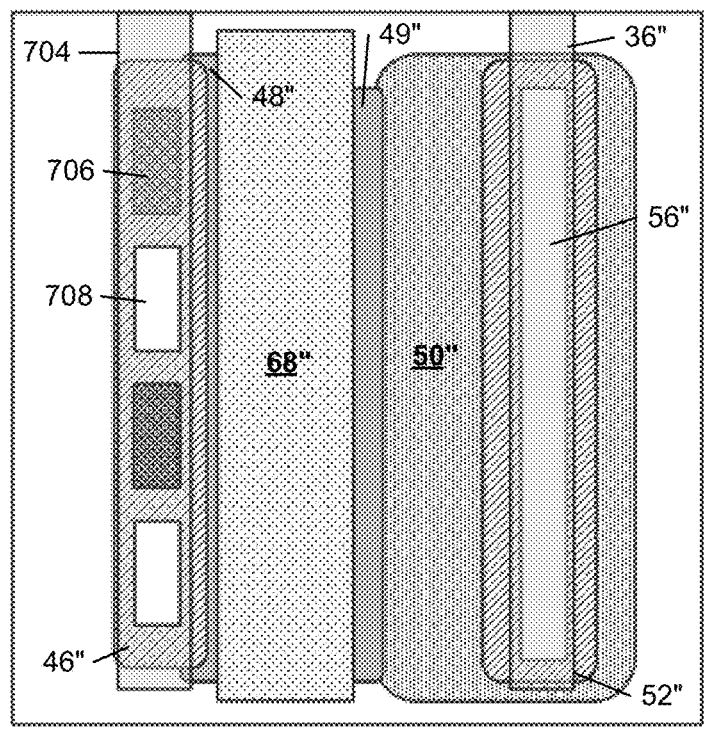
FIG. 15 is a diagrammatic top-down view of a second example layout for the LDFET structure of FIG. 10A, in accordance with some embodiments.

In some examples, the substrate contact includes a first set of parallel substrate sub-contacts that are interleaved with a second set of parallel channel sub-contacts that are connected to one of the sources and drains of the first and second LDFETs, where the respective sub-contacts of the first and second sets extend to a surface above the active layer where they are alternately arranged in a row. For example, FIG. 15 shows a diagrammatic top-down view of a second example layout for the LDFET structure 700 of FIG. 10A in which the source contact is implemented by a planar array of a set of parallel vertical source contacts 706 that extend from the source 46" to the front-side contact 704, and the substrate contact is implemented by a planar array of a set of parallel vertical substrate contacts 708 that are interleaved with and extend from the substrate 45" to the front-side contact 704. Alternating the source contacts 706 and the substrate contacts 708 in this way reduces the transistor pitch as compared to the embodiment shown in FIG. 13. A horizontally reflected version of the layout shown in FIG. 15 can be used for the drain-down LDFET structure 710 shown in FIG. 10B.

Figure 16:
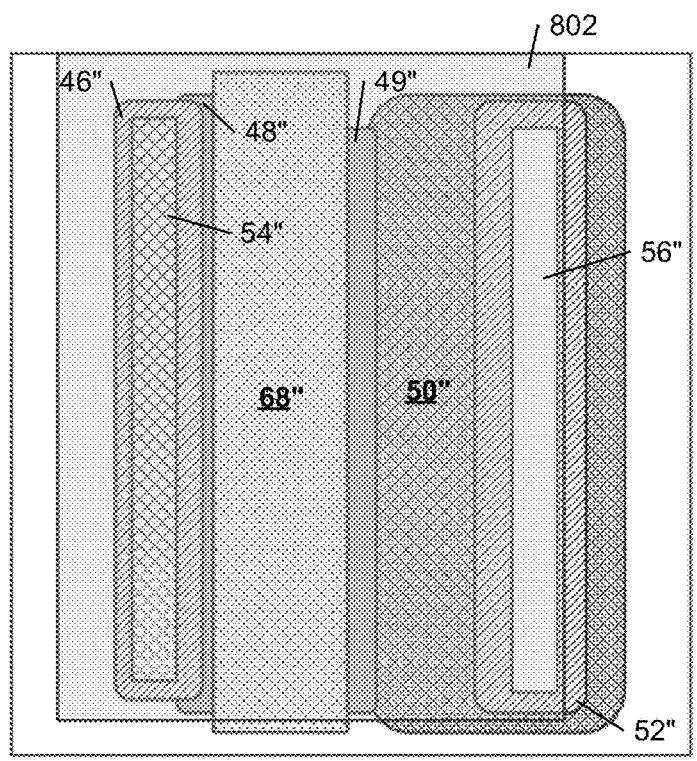
FIG. 16 is a diagrammatic top-down view of an example layout for the LDFET structures of FIGS. 11A and 12A, in accordance with some embodiments.

FIG. 16 shows a diagrammatic top-down view of an example layout for the LDFET structure 800 of FIG. 11A in which the source contact 54" extends to the substrate but does not extend to the front-side of the die. As explained above, this feature allows the front-side contact 802 of the drain to be laid out without regard to the location of the source contact 54". In the illustrated example, the front-side drain contact 802 extends over and beyond the source contact 54" without electrically connecting to the source contact 54". The example layout shown in FIG. 16 is equally applicable to the source-down LDFET structure 900 of FIG. 12A. In addition, a horizontally reflected version of the layout shown in FIG. 16 can be used for the drain-down LDFET structures 810, 910 shown in FIGS. 11B and 12B.

Figure 17:
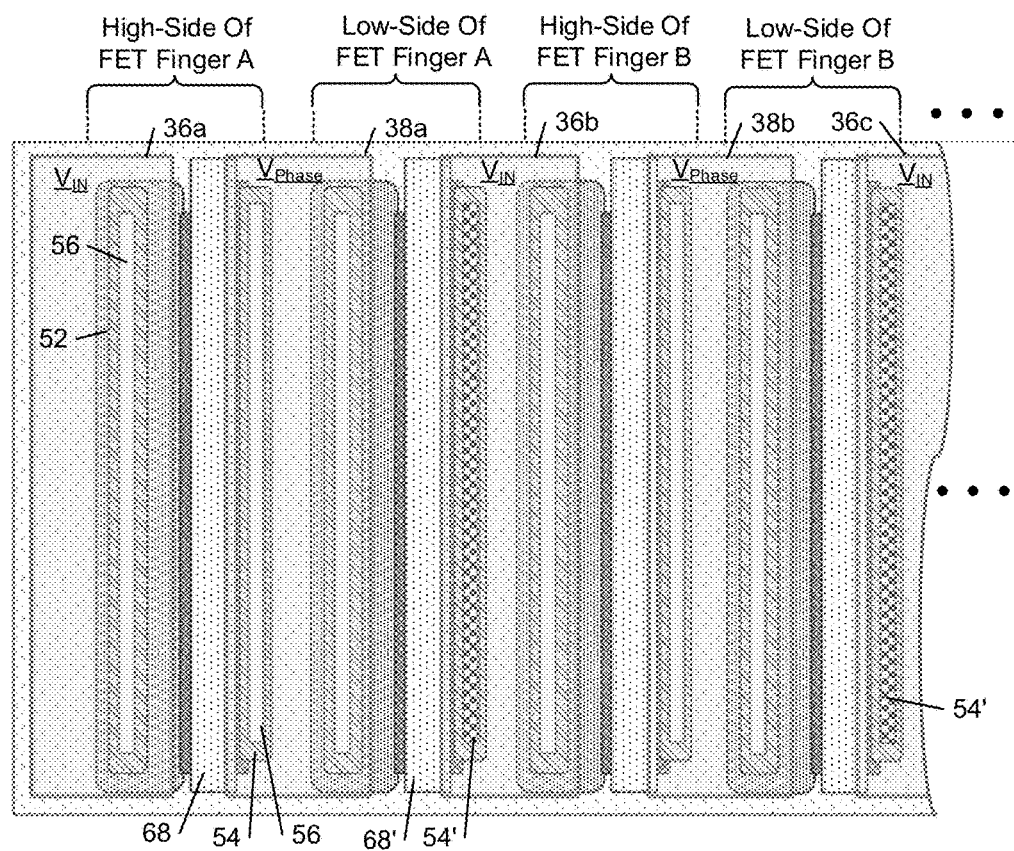
FIG. 17 is a diagrammatic top-down view of an example layout of the LDFET circuit of FIG. 2, in accordance with some embodiments.

FIG. 17 shows a diagrammatic top-down view of an example layout for the LDFET circuit of FIG. 2. In this example, the high-side and low-side LDFETs 32, 34 are implemented by a set of multiple interleaved high-side and low-side LDFET "fingers" that are interconnected by a set of alternating electrically conducting paths of input node metallization (e.g., $V_{IN}$) and phase node metallization (e.g., $V_{PHASE}$). In this approach, the constituent high-side and low-side LDFET fingers can be placed close together, allowing the interconnecting metallization paths between the high-side drain and the low-side source to be short, low impedance connections that collectively have a lower overall impedance than the impedance through a circuit structure in which the high-side and low-side transistors are laid out in separate sections of a semiconductor die. As a result, the impedance through the LDFET circuit from the high-side source to the low-side drain is reduced. In some examples, additional layers of metal may be needed to pull out the respective connections from the LDFET fingers to the package pins. In some examples, multiple of the input node finger metallization paths (e.g., 36a, 36b, and 36c) are connected to a first electrically conducting output path that is connected to the input node (e.g., $V_{IN}$), and multiple of the phase node finger metallization paths (e.g., 38a and 38b) are connected to a second electrically conducting output path that is connected to the phase node (e.g., $V_{PHASE}$).

Figure 18:
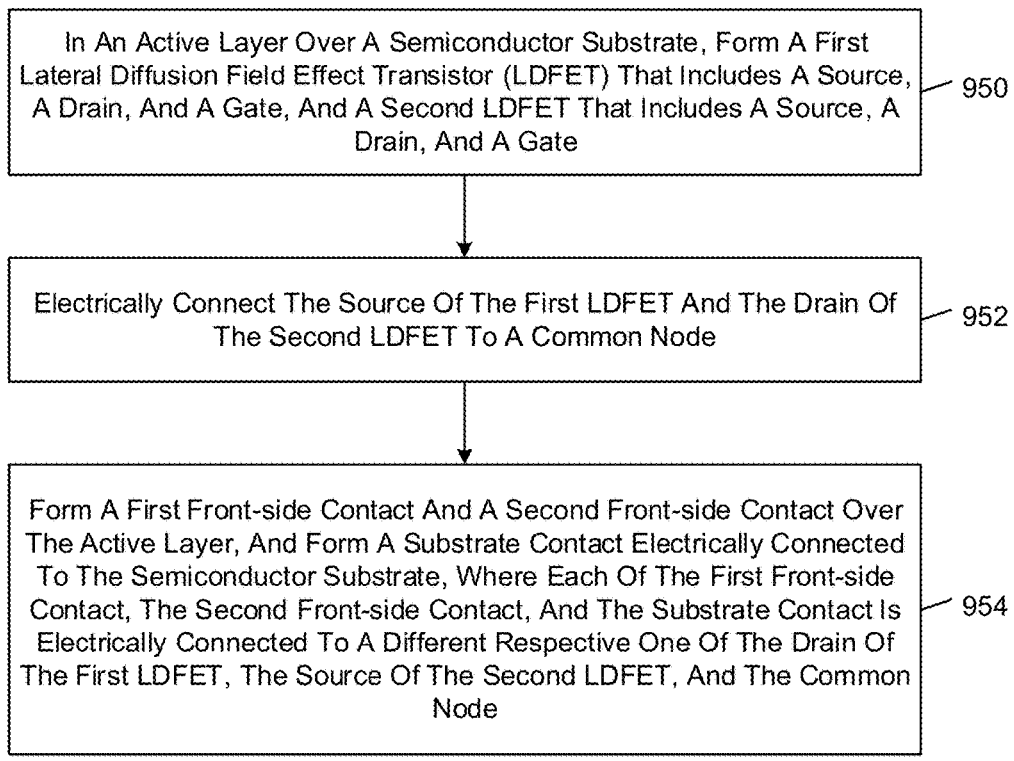
FIG. 18 is a flow diagram of an example of a method of fabricating a semiconductor device, in accordance with some embodiments.

FIG. 18 shows an example of a method fabricating a semiconductor device. In accordance with this method, a first lateral diffusion field effect transistor (LDFET) that includes a source, a drain, and a gate, and a second LDFET that includes a source, a drain, and a gate are formed in an active layer over a semiconductor substrate (FIG. 18, block 950). The source of the first LDFET and the drain of the second LDFET are electrically connected to a common node (FIG. 18, block 952). A first front-side contact and a second front-side contact are formed over the active layer, and a substrate contact electrically connected to the semiconductor substrate is formed, where each of the first front-side contact, the second front-side contact, and the substrate contact is electrically connected to a different respective one of the drain of the first LDFET, the source of the second LDFET, and the common node (FIG. 18, block 954).

In some examples, a buried dielectric layer is formed between the semiconductor substrate and the active layer, where the substrate contact extends through the buried dielectric layer. In some of these examples, a dielectric isolation barrier that extends through the active layer to the buried dielectric layer also is formed between the first and second LDFETs.

In some examples, the first front-side contact is electrically connected to a first set of one or more of the perimeter package leads of a semiconductor package with a first electrically conductive clip. The second front-side contact is electrically connected to a second set of one or more of the perimeter package leads of the semiconductor package with a second electrically conductive clip. The substrate contact is electrically connected to a paddle of the semiconductor package.

Other embodiments are within the scope of the claims. For example, Semiconductor devices disclosed herein have improved performance in high power conditions. However, the teachings disclosed herein can be used to improve semiconductor devices generally and are not limited to high power applications. Certain methods disclosed herein allow for a cost effective and efficient manner in which to build the disclosed devices. In the particular situations in which the semiconductor device is a transistor, the body of the device is efficiently biased to prevent the device from entering into particular breakdown conditions such as those caused by an increase in the potential of the body of the transistor. Some of these semiconductor devices are therefore useful in situations in which the devices are formed in a thin layer of active material because it is in those situations in which the body of the semiconductor device is more susceptible to the introduction of exogenous charge, as there is less intrinsic charge in the thin active layer to counteract its effect.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

The invention claimed is:

1. A semiconductor device, comprising:
a semiconductor substrate supporting an overlying active layer;
a first lateral diffusion field effect transistor (LDFET) in the active layer and comprising a source, a drain, and a gate;
a second LDFET in the active layer and comprising a source, a drain, and a gate;
a common node electrically and physically connected to the source of the first LDFET and the drain of the second LDFET;
a first front-side contact over the active layer and electrically and physically connected to a first one of: the drain of the first LDFET, the source of the second LDFET, and the common node;
a second front-side contact over the active layer and electrically and physically connected to a second one of: the drain of the first LDFET, the source of the second LDFET, and the common node;
a substrate contact electrically and physically connected to the semiconductor substrate and a third one of: the drain of the first LDFET, the source of the second LDFET, and the common node;
a buried dielectric layer between the semiconductor substrate and the active layer, wherein the substrate contact extends through the buried dielectric layer; and
a dielectric isolation barrier disposed between the first LDFET and the second LDFET and that extends through the active layer to the buried dielectric layer;
wherein each of the first front-side contact, the second front-side contact, and the substrate contact is electrically and physically connected to a different respective one of the drain of the first LDFET, the source of the second LDFET, and the common node.

2. The semiconductor device of claim 1, wherein the buried dielectric layer extends under the source of the first LDFET, the drain of the first LDFET, the gate of the first LDFET, the source of the second LDFET, the drain of the second LDFET, and the gate of the second LDFET, a portion of the buried dielectric layer being omitted where the substrate contact intersects a plane of the buried dielectric layer.

3. The semiconductor device of claim 1, wherein the substrate contact extends through the active layer.

4. The semiconductor device of claim 3, wherein the substrate contact extends through one of the sources and drains of the first and second LDFETs.

5. The semiconductor device of claim 4, wherein the substrate contact is electrically and physically connected to the common node.

6. The semiconductor device of claim 4, wherein the substrate contact is electrically and physically connected to one of the first and second front-side contacts.

7. The semiconductor device of claim 3, wherein the substrate contact comprises a first set of parallel substrate sub-contacts that are interleaved with a second set of parallel channel sub-contacts that are connected to one of the sources and drains of the first and second LDFETs, wherein the respective sub-contacts of the first and second sets extend to a surface above the active layer where they are alternately arranged in a row.

8. The semiconductor device of claim 3, wherein the substrate contact extends through the active layer in a region free of any of the sources and drains of the first and second LDFETs, the region extending from a top surface of the active layer to a top surface of the semiconductor substrate, and the substrate contact is electrically and physically connected to one of the sources and drains of the first and second LDFETs by an electrical connection that extends laterally over the active layer and downward through one of the sources and drains of the first and second LDFETs.

9. The semiconductor device of claim 8, wherein the substrate contact extends through an opening in the active layer that extends from the buried dielectric layer through the active layer.

10. The semiconductor device of claim 9, wherein an edge-to-edge span of the substrate contact and an edge-to-edge span of the opening in the active layer have respective widths in a lateral dimension orthogonal to an axial dimension along which the substrate contact extends, and the width of the opening in the active layer is greater than the width of the substrate contact.

11. The semiconductor device of claim 3, wherein the substrate contact extends through the active layer to the semiconductor substrate along an axial dimension, the substrate contact has a top portion that extends into the active layer, the top portion having an edge-to-edge span that is characterized by a first width in a lateral dimension orthogonal to the axial dimension, and the substrate contact has a bottom portion that extends into the active layer, the bottom portion having an edge-to-edge span that is characterized by a second width in the lateral dimension that is smaller than the first width.

12. The semiconductor device of claim 1, further comprising a first electrically conductive clip and a second electrically conductive clip, wherein the first and second electrically conductive clips are electrically and physically connected to two of the first front-side contact, the second front-side contact, and the substrate contact.

13. The semiconductor device of claim 1, further comprising a first electrically conductive clip electrically and physically connected to the first front-side contact and a second electrically conductive clip electrically and physically connected to the second front-side contact.

14. A semiconductor device, comprising:
a semiconductor substrate supporting an overlying active layer;
a first lateral diffusion field effect transistor (LDFET) in the active layer and comprising a source, a drain, and a gate;
a second LDFET in the active layer and comprising a source, a drain, and a gate, wherein the source of the first LDFET is electrically and physically coupled to the drain of the second LDFET;
a first front-side contact over the active layer and electrically and physically connected to the drain of the first LDFET;
a second front-side contact over the active layer and electrically and physically connected to the drain of the second LDFET and the source of the first LDFET;
a substrate contact electrically and physically connected to the semiconductor substrate and the source of the second LDFET;
a buried dielectric layer between the semiconductor substrate and the active layer, wherein the substrate contact extends through the buried dielectric layer; and
a dielectric isolation barrier disposed between the first LDFET and the second LDFET and that extends through the active layer to the buried dielectric layer.

15. The semiconductor device of claim 14, wherein the buried dielectric layer extends under the source of the first LDFET, the drain of the first LDFET, the gate of the first LDFET, the source of the second LDFET, the drain of the second LDFET, and the gate of the second LDFET, a portion of the buried dielectric layer being omitted where the substrate contact intersects a plane of the buried dielectric layer.

16. A semiconductor device, comprising:
a semiconductor substrate supporting an overlying active layer;
a first lateral diffusion field effect transistor (LDFET) in the active layer and comprising a source, a drain, and a gate;
a second LDFET in the active layer and comprising a source, a drain, and a gate, wherein the drain of the first LDFET is electrically and physically coupled to the source of the second LDFET;
a first front-side contact over the active layer and electrically and physically connected to the source of the first LDFET;
a second front-side contact over the active layer and electrically and physically connected to the drain of the second LDFET;
a substrate contact electrically and physically connected to the semiconductor substrate, the drain of the first LDFET, and the source of the second LDFET;
a buried dielectric layer between the semiconductor substrate and the active layer, wherein the substrate contact extends through the buried dielectric layer; and
a dielectric isolation barrier disposed between the first LDFET and the second LDFET and that extends through the active layer to the buried dielectric layer.

17. The semiconductor device of claim 16, wherein the buried dielectric layer extends under the source of the first LDFET, the drain of the first LDFET, the gate of the first LDFET, the source of the second LDFET, the drain of the second LDFET, and the gate of the second LDFET, a portion of the buried dielectric layer being omitted where the substrate contact intersects a plane of the buried dielectric layer.

18. A method of fabricating a semiconductor device, comprising:
in an active layer over a semiconductor substrate, forming a first lateral diffusion field effect transistor (LDFET) comprising a source, a drain, and a gate, and a second LDFET comprising a source, a drain, and a gate;
electrically connecting the source of the first LDFET and the drain of the second LDFET to a common node;
over the active layer, forming a first front-side contact and a second front-side contact;
forming a substrate contact that is electrically and physically connected to the semiconductor substrate;
forming a buried dielectric layer between the semiconductor substrate and the active layer, wherein the substrate contact extends through the buried dielectric layer; and
forming between the first and second LDFETs a dielectric isolation barrier that extends through the active layer to the buried dielectric layer;
wherein each of the first front-side contact, the second front-side contact, and the substrate contact is electrically and physically connected to a different respective one of the drain of the first LDFET, the source of the second LDFET, and the common node.

19. The method of claim 18, wherein the buried dielectric layer extends under the source of the first LDFET, the drain of the first LDFET, the gate of the first LDFET, the source of the second LDFET, the drain of the second LDFET, and the gate of the second LDFET, a portion of the buried dielectric layer being omitted where the substrate contact intersects a plane of the buried dielectric layer.

* * * * *